US009222732B2

(12) United States Patent
Shirako et al.

(10) Patent No.: US 9,222,732 B2
(45) Date of Patent: Dec. 29, 2015

(54) SUBSTRATE PROCESSING APPARATUS AND METHOD OF MANUFACTURING SEMICONDUCTOR DEVICE

(75) Inventors: Kenji Shirako, Toyama (JP); Takatomo Yamaguchi, Toyama (JP); Shuhei Saido, Toyama (JP); Akihiro Sato, Toyama (JP)

(73) Assignee: HITACHI KOKUSAI ELECTRIC INC., Toyko (JP)

( * ) Notice: Subject to any disclaimer, the term of this patent is extended or adjusted under 35 U.S.C. 154(b) by 498 days.

(21) Appl. No.: 13/229,543

(22) Filed: Sep. 9, 2011

(65) Prior Publication Data

US 2012/0067869 A1    Mar. 22, 2012

(30) Foreign Application Priority Data

Sep. 16, 2010    (JP) ................................. 2010-208399

(51) Int. Cl.
*H05B 6/00*    (2006.01)
*H05B 6/22*    (2006.01)
(Continued)

(52) U.S. Cl.
CPC . *F28F 1/00* (2013.01); *C23C 16/44* (2013.01); *C23C 16/4584* (2013.01);
(Continued)

(58) Field of Classification Search
CPC ....... F24C 7/06; F26B 3/30; H01L 21/67115; H05B 3/16; H05B 6/105; H05B 6/145; H05B 6/42; H05B 6/02; H05B 6/362; H05B 6/102; H01C 7/027; C30B 13/20; C21D 1/42; C23C 16/46; B05B 13/0242; B05B 13/0285
USPC ......... 219/407, 409–411, 542, 553, 618, 619, 219/632, 635, 638, 643, 647, 674, 652; 373/119; 118/725, 58, 500
See application file for complete search history.

(56) References Cited

U.S. PATENT DOCUMENTS 5,320,680 A * 6/1994 Learn et al. .................... 118/724
5,478,397 A * 12/1995 Shibata et al. ................ 118/724
(Continued)

FOREIGN PATENT DOCUMENTS

JP    2003282579 A    10/2003
JP    2007095923 A    4/2007

OTHER PUBLICATIONS

Horn, F. L., Fillo, J. A., Powell, J. R., Thermal Conductivity Measurements of Insulators for Fusion Blankets, 1981, NTIS, p. 1-3.*
(Continued)

*Primary Examiner* — Dana Ross
*Assistant Examiner* — Hemant Mathew
(74) *Attorney, Agent, or Firm* — Volpe and Koenig, P.C.

(57) ABSTRACT

Provided is a substrate processing apparatus capable of maintaining a temperature of a furnace port part at a heat-resistant temperature or less of each member constituting the furnace part. The substrate processing apparatus includes a process chamber configured to process a plurality of substrates vertically stacked at predetermined intervals; a substrate retainer configured to hold the plurality of substrates in the process chamber; and a first heat exchanger installed in the process chamber to support the substrate retainer from a lower portion of the substrate retainer, and configured to perform a heat exchange with a gas flowing in a downward direction from a side of the substrate retainer in the process chamber, wherein the first heat exchanger includes a hollow cylindrical insulating tube vertically extending in the downward direction and an insulating plate installed in the insulating tube, and regions in the insulating tube over and under the insulating plate are spatially connected to each other.

15 Claims, 24 Drawing Sheets

(51) Int. Cl.
  *F28F 1/00* (2006.01)
  *C23C 16/44* (2006.01)
  *C23C 16/458* (2006.01)
  *C30B 25/02* (2006.01)
  *C30B 29/36* (2006.01)
  *F28F 3/08* (2006.01)
  *H01L 21/67* (2006.01)
  *H05B 6/02* (2006.01)
  *H05B 6/10* (2006.01)
  *F28F 21/02* (2006.01)

(52) U.S. Cl.
  CPC ............... *C30B 25/02* (2013.01); *C30B 29/36* (2013.01); *F28F 3/086* (2013.01); *H01L 21/67109* (2013.01); *F28F 21/02* (2013.01); *H05B 6/02* (2013.01); *H05B 6/105* (2013.01)

(56) References Cited

U.S. PATENT DOCUMENTS

| | | | |
|---|---|---|---|
| 6,005,225 A * | 12/1999 | Kowalski et al. | 219/390 |
| 6,369,361 B2 * | 4/2002 | Saito et al. | 219/390 |
| 2002/0102353 A1 * | 8/2002 | Mauthner et al. | 427/255.28 |
| 2002/0182870 A1 * | 12/2002 | Matsunaga et al. | 438/700 |
| 2003/0183614 A1 * | 10/2003 | Yamaguchi et al. | 219/390 |
| 2008/0023141 A1 * | 1/2008 | Shimizu et al. | 156/345.29 |

OTHER PUBLICATIONS

NSM Archive—Silicon Carbide (SiC) Thermal Properties, Jun. 3, 2004, NSM Archive, p. 1-6.*
Heraeus Quarzglas Thermal Properties, Apr. 28, 2009, Heraeus, p. 1.*

* cited by examiner

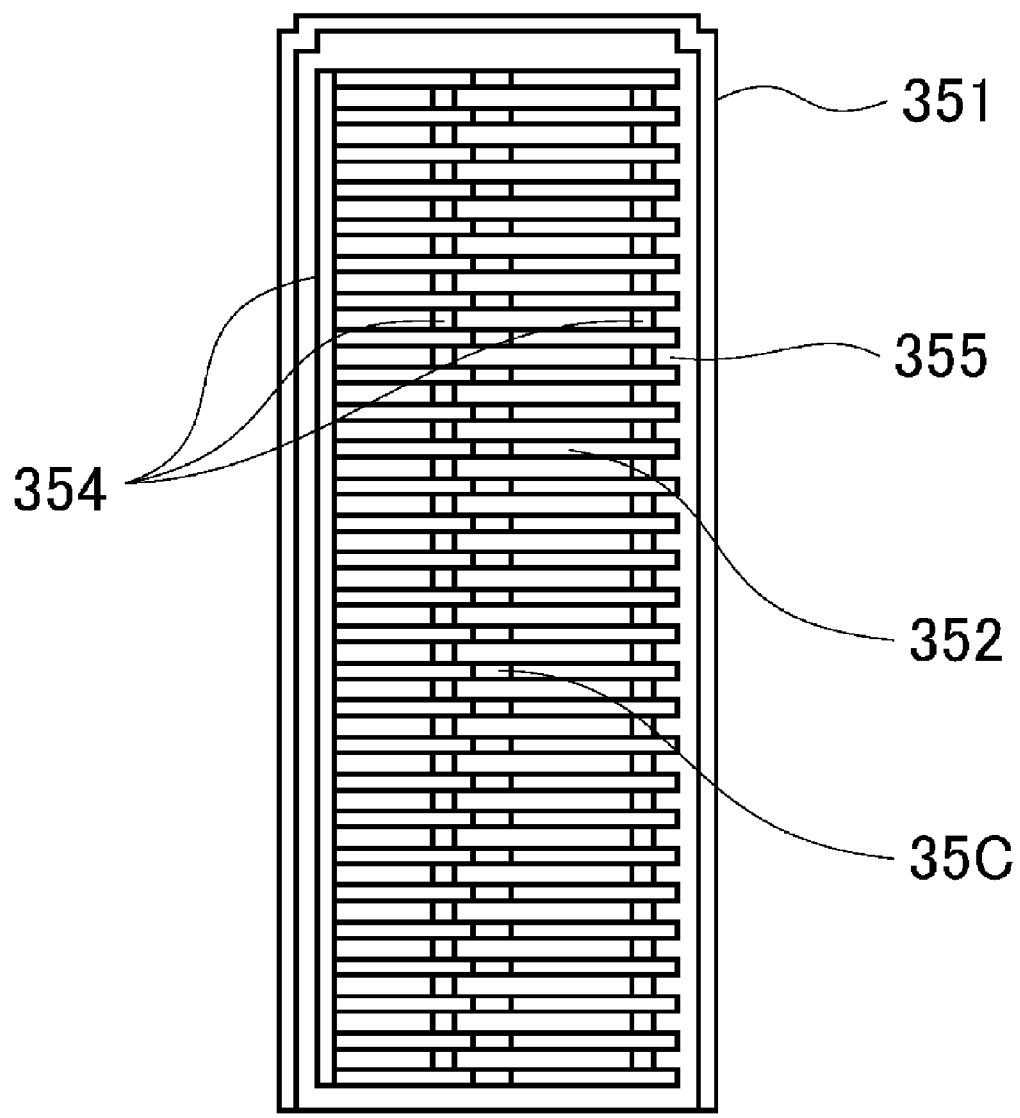

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2010-208399, filed on Sep. 16, 2010, in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device.

2. Description of the Related Art

In a related art, a vertical substrate processing apparatus including a substrate retainer (susceptor) vertically stacking and holding a plurality of substrates and a process chamber accommodating the susceptor, and configured to perform processing of the plurality of substrates in the process chamber by induction-heating the susceptor accommodated in the process chamber to heat the plurality of substrates held by the susceptor and supplying a reaction gas into the process chamber is already known (for example, see Patent Document 1). The substrate processing apparatus covers the entire periphery of the process chamber with an insulating material by supporting the substrate retainer holding the substrate at its lower side using a lower insulating material, installing an inner insulating material around the lower insulating material in a horizontal direction, and installing an upper insulating material installed at an upper side of the substrate retainer. In the substrate processing apparatus, since the entire periphery of the process chamber is covered by the insulating material, an insulating effect (heat conservation effect) of the process chamber can be improved, and temperature distribution of the process chamber can be uniformized.

RELATED ART DOCUMENT

Patent Document 1

1. Japanese Unexamined Patent Application Publication No. 2007-095923

The process chamber of the vertical substrate processing apparatus is formed in a reaction vessel having a reaction tube and a manifold, which vertically overlap with each other. The reaction tube disposed at an upper side of the process chamber is generally formed of quartz, and the manifold disposed at a lower side of the process chamber is generally formed of a metal. A heat-resistant temperature of each member constituting the manifold is generally lower than a substrate processing temperature. When the substrate processing temperature is high, radiation from a substrate region in the process chamber to the manifold is strong. In addition, since a carrier gas is needed to process the substrate, a large amount of heat energy is transported from the substrate region to the manifold by the carrier gas. Accordingly, one problem of the substrate processing apparatus may be an increase in temperature of the manifold. In order to protect each member constituting the manifold, the temperature of the manifold must be maintained at the heat-resistant temperature of each member or less.

However, in Patent Document 1, while an insulating effect can effectively prevent radiation to the manifold, heat transport is not considered. Accordingly, the gas may be leaked to a furnace port of the manifold in a high temperature state. For this reason, since there may be a case in which a temperature of each member of the furnace port cannot be maintained at the heat-resistant temperature or less, heat deterioration of the member may occur.

SUMMARY OF THE INVENTION

The present invention provides a substrate processing apparatus and a method of manufacturing a semiconductor device capable of suppressing heat deterioration, etc. of a member of a lower side of a process chamber.

According to an aspect, there is provided a substrate processing apparatus including: a process chamber configured to process a plurality of substrates vertically stacked at predetermined intervals; a substrate retainer configured to hold the plurality of substrates in the process chamber; and a first heat exchanger installed in the process chamber to support the substrate retainer from a lower portion of the substrate retainer, and configured to perform a heat exchange with a gas flowing in a downward direction from a side of the substrate retainer in the process chamber, wherein the first heat exchanger includes a hollow cylindrical insulating tube vertically extending in the downward direction and an insulating plate installed in the insulating tube, and regions in the insulating tube over and under the insulating plate are spatially connected to each other.

According to another aspect, there is provided a substrate processing apparatus including: a process chamber configured to process a plurality of substrates vertically stacked at predetermined intervals; a substrate retainer configured to hold the plurality of substrates in the process chamber; a first heat exchanger installed in the process chamber to support the substrate retainer from a lower portion of the substrate retainer, and configured to perform a heat exchange with a gas flowing in a downward direction from a side of the substrate retainer in the process chamber; and a lower insulating part installed under the first heat exchanger and made of a material having a thermal conductivity lower than that of the first heat exchanger.

According to still another aspect, there is provided a method of manufacturing a semiconductor device including: a loading step of loading a plurality of substrates stacked in a vertical direction at predetermined intervals into a process chamber; and a processing step of processing the plurality of substrates in the process chamber by induction-heating an inside of the process chamber using an induction heating part installed around the process chamber and supplying at least a gas into the process chamber, wherein, in the loading step, in a state in which the plurality of substrates are held by a substrate retainer and the substrate retainer is supported by a first heat exchanger including a hollow cylindrical insulating tube extending in a vertical direction and an insulating plate installed in the insulating tube and in which regions over and under the insulating plate in the insulating tube are spatially connected to each other, from a lower portion of the substrate retainer, the substrate retainer and the first heat exchanger are loaded into the process chamber, and in the processing step, the first heat exchanger performs heat exchange with a gas flowing in a downward direction from a side of the substrate retainer along the insulating tube of the first heat exchanger in the process chamber.

According to the present invention, heat deterioration, etc. of a member of a lower side of a process chamber can be suppressed.

DETAILED DESCRIPTION OF THE PREFERRED EMBODIMENTS

Figure 1:
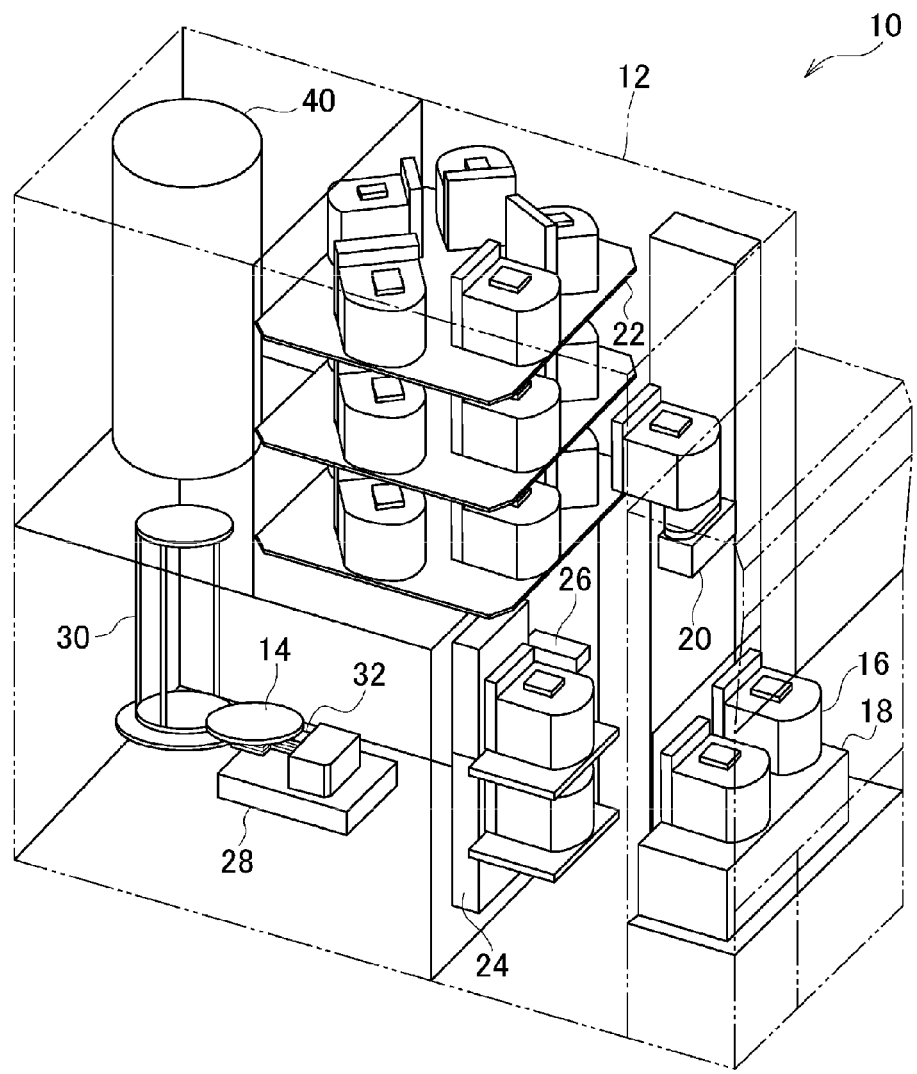
FIG. 1 is a perspective view showing a configuration example of a substrate processing apparatus according to an embodiment of the present invention.

As described above, since a conventional substrate processing apparatus in which the entire periphery of a process chamber is covered by an insulating material provides a high insulating effect of the process chamber, a gas in a high temperature state is discharged to a lower side of the process chamber. For this reason, it is difficult to maintain the temperature of each member constituting the lower side of the process chamber at the heat resistant temperature or less.

According to an embodiment of the present invention, the apparatus includes a first heat exchanger configured to support a lower side of a substrate retainer in a process chamber. The first heat exchanger includes a vertically extending hollow cylindrical insulating tube, and an insulating plate installed in the insulating tube, wherein regions over and under the insulating plate in the insulating tube are spatially connected to each other. In addition, the first heat exchanger performs heat exchange with a gas flowing in a downward direction from a side of the substrate retainer in the process chamber. As described above, since the gas in the process chamber is heat-exchanged to be cooled until the high temperature gas arrives at the lower side of the process chamber and the insulating plate is installed in the insulating tube to suppress heat transfer due to radiation, heat deterioration of the member at the lower side of the process chamber can be suppressed. Further, since the regions over and under the insulating plate are spatially connected to each other, a pressurized state of the regions after the heat exchange can be suppressed to maintain a decompressed state, and the regions can be prevented from becoming a contamination source of the remaining air, and so on.

In addition, according to the embodiment of the present invention, the first heat exchanger configured to support the lower portion of the substrate retainer in the process chamber performs heat exchange with the gas flowing in a downward direction from the side of the substrate retainer in the process chamber. Further, an insulating ring is installed at the lower side of the first heat exchanger to surround a lower insulating part and its side portion. The lower insulating part and the insulating ring are made of a material having a thermal conductivity lower than that of the first heat exchanger. Accordingly, even when the first heat exchanger reaches a high temperature due to heat exchange with the gas in the process chamber, the heat from the first heat exchanger is insulated by the lower insulating part to suppress heat transfer to the member at the lower side of the process chamber. Further, since the insulating ring can suppress introduction of the gas lowered along the first heat exchanger to the inside of the insulating ring, heat deterioration of the member at the lower side of the process chamber (in particular, the member disposed near a center of a circumference of the insulating ring) can be suppressed.

Embodiment of the Present Invention

Hereinafter, an embodiment of the present invention will be described with reference to the accompanying drawings.

(1) Configuration of Substrate Processing Apparatus

First, a configuration of a substrate processing apparatus processing a silicon carbide (SiC) substrate as a substrate will be described.

Silicon carbide (hereinafter referred to as SiC) has a wider energy band gap, a higher withstand voltage, and a higher thermal conductivity than silicon (hereinafter referred to as Si), and so on, and is thus receiving attention as, in particular, a power device material. Meanwhile, it has been known that, since SiC does not have a liquid phase under a normal pressure and has a small impurity diffusion coefficient, and so on, a crystalline substrate or a semiconductor device cannot be easily manufactured in comparison with Si. For example, since SiC has an epitaxial film-forming temperature of about 1500° C. to 1800° C., which is higher than that of Si, 900° C. to 1200° C., technical research into a heat-resistant structure of the substrate processing apparatus for forming a SiC epitaxial film is needed.

(Entire Apparatus)

FIG. 1 shows a perspective view of a substrate processing apparatus 10 according to an embodiment of the present invention. The substrate processing apparatus 10 is configured as a batch-type vertical heat treatment apparatus. The substrate processing apparatus 10 includes a housing 12 in which major parts such as a process furnace 40 are disposed. In the substrate processing apparatus 10, a front opening unified pod (FOUP, hereinafter referred to as a pod) 16 is used as a wafer carrier, which is a substrate accommodation unit accommodating a wafer 14, which is a substrate formed of SiC. A pod stage 18 is disposed in front of the housing 12. The pod 16 is conveyed onto the pod stage 18 and placed thereon. The pod 16 accommodates, for example, twenty five sheets of wafers 14 therein. The pod 16 is placed on the pod stage 18 in a state in which a cover (not shown) is closed.

A pod conveyance apparatus 20 is disposed at a front side in the housing 12 to be opposite to the pod stage 18. A pod shelf 22, a pod opener 24 and a substrate number detector 26 are disposed near the pod conveyance apparatus 20. The pod shelf 22 is disposed over the pod opener 24, and holds a plurality of pods 16 placed thereon. The substrate number detector 26 is disposed adjacent to the pod opener 24. The pod conveyance apparatus 20 conveys the pod 16 between the pod stage 18, the pod shelf 22 and the pod opener 24. The pod opener 24 is configured to open a cover of the pod 16. The substrate number detector 26 detects the number of the wafers 14 in the pod 16 in which the cover is open.

In the housing 12, a substrate transfer apparatus 28, and a boat 30, which is a substrate retainer, are disposed. The substrate transfer apparatus 28 includes an arm 32 (tweezers) that can extract, for example, five sheets of wafers 14. The arm 32 is vertically and rotatably operated by a drive means (not shown) to convey the wafer 14 between the pod 16 and the boat 30 placed at a position of the pod opener 24.

The process furnace 40 is disposed at an upper side of a rear surface in the housing 12. In the process furnace 40, the boat 30 in which the plurality of wafers 24 are loaded is conveyed from the lower side thereof.

(Process Furnace)

Hereinafter, the process furnace 40 will be described.

Figure 2:
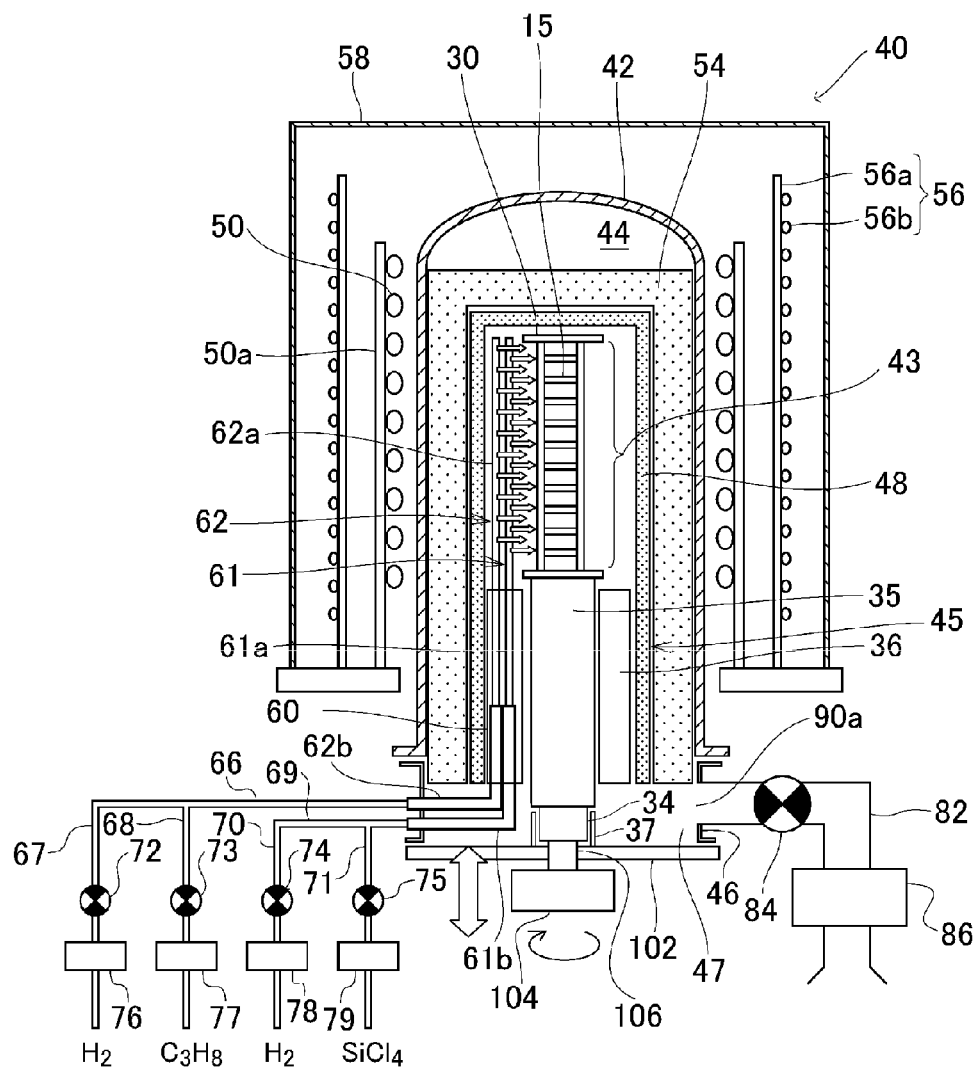
FIG. 2 is a vertical cross-sectional view showing a configuration example of a process furnace used in the substrate processing apparatus according to an embodiment of the present invention.

FIG. 2 shows a vertical cross-sectional view of the process furnace 40. In addition, in FIG. 2, as a gas supply part 60, for example, a carbon-based raw material supply nozzle 62 and a Si-based raw material supply nozzle 61 are shown as representative examples.

The process furnace 40 includes a cylindrical reaction tube 42. The reaction tube 42 is formed of a heat-resistant material such as quartz ($SiO_2$) or silicon carbide (SiC), and has a cylindrical shape with an upper end closed and a lower end open. A process chamber 44 is formed at a tubular hollow part inside the reaction tube 42. The process chamber 44 is configured to accommodate the wafers horizontally held by the boat 30 in a vertically aligned state in a multi-stage manner. The reaction tube 42 may have a single tube structure or a dual tube structure constituted by an inner tube and an outer tube.

In a wafer region 43 in which the wafer 14 in the process chamber 44 is heat-treated, the boat 30 holds the plurality of wafers spaced predetermined intervals apart in a vertical direction. The wafers may be held, for example, at predetermined intervals. In addition, in this embodiment, the wafer is held by a wafer holder 15, and the boat 30 holds a plurality of wafer holders 15 in a shelf shape. The boat 30 is formed of, for example, carbon graphite coated with SiC, or a heat resistant material (1500° C. to 1800° C.) such as SiC. The plurality of wafer holders 15, on which the wafers are held, respectively, are horizontally aligned to be concentric with each other and vertically held in a multi-stage manner.

Figure 3:
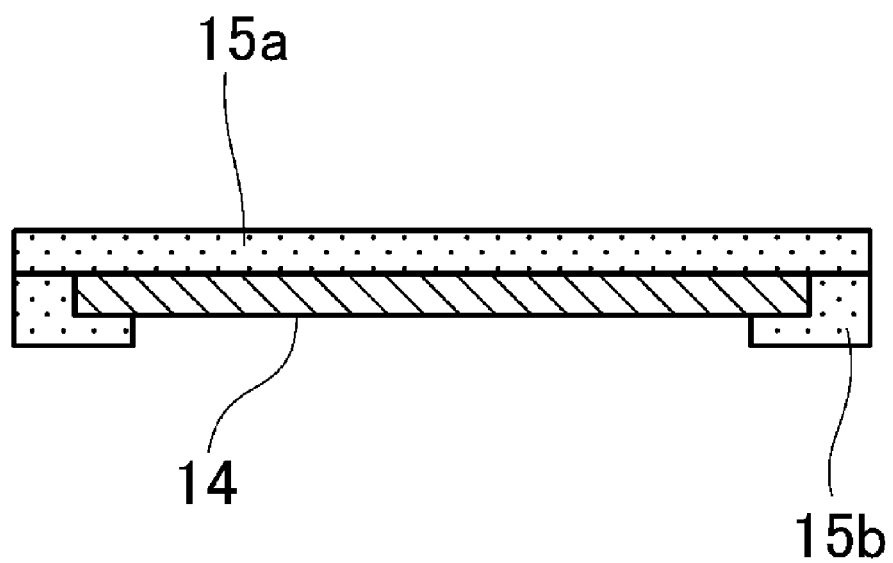
FIG. 3 is a vertical cross-sectional view showing a configuration example of a substrate holder part used in the substrate processing apparatus according to an embodiment of the present invention.

The wafer holder 15 employs, for example, as shown in FIG. 3, a face down method in which a crystal growth surface (main face or surface) of the wafer 14 is fixed to be directed downward. In the face down method, the wafer holder 15 is constituted by an upper holder 15a and a lower holder 15b formed of carbon graphite coated with SiC. The upper holder 15a has a disc shape, and covers the crystal growth surface of the wafer 14 and a rear surface thereof to prevent a film from being formed on the rear surface of the wafer 14. The lower holder 15b has an annular shape, in which an inner edge is thinner than an outer edge, such that the wafer 14 is accommodated and held at the inner edge. Further, the boat 30 includes a column having a groove, and the wafer holder 15 on which the wafer is held is transferred to the groove.

A manifold 46 is disposed at a lower side of the reaction tube 42 to be concentric with the reaction tube 42. The manifold 46 is formed of a metal such as stainless steel, and has a cylindrical shape with upper and lower ends opened. The manifold 46 is installed to support a lower side of the reaction tube 42. In addition, an O-ring, which is a sealing member, is installed between the manifold 46 and the reaction tube 42. As the manifold 46 is supported by a retainer (not shown), the reaction tube 42 is vertically installed. Mainly, a reaction vessel is formed by the reaction tube 42 and the manifold 46. The process chamber 44 is formed in the reaction vessel.

The process furnace 40 is provided with a substrate heating part including a body to be heated (susceptor) 48, which is a body to be induced, and an induction coil 50, which is an alternating magnetic flux generating part. The body to be heated 48 is disposed in the process chamber 44. The body to be heated 48 has a cylindrical shape to surround an upper portion of the boat 30, an outer circumference of the boat 30, and a lower portion of the boat 30.

The cylindrical body to be heated 48 is formed of, for example, carbon graphite coated with SiC. An alternating magnetic field generated by the induction coil 50 installed outside the reaction tube 42 flows an induction current (over-current) to heat the body to be heated 48. As the body to be heated 48 is heated, the inside of the process chamber 44 is heated by radiation heat, and the wafer 14 in the process chamber 44 is heated to a processing temperature.

The induction coil 50 is supported by a coil support column 50a, which is a support body. The coil support column 50a is formed of an insulating material such as a ceramic material, typically, alumina. In addition, the induction coil 50 is disposed outside the process chamber 44 to correspond to the wafer region 43 in the process chamber 44. Accordingly, when the induction coil 50 generates an alternating magnetic field, since the wafer region 43 in the process chamber 44 is mainly heated, an over-current does not flow through an insulating region 45 of the body to be heated 48 and thus the insulating region 45 is not heated. Here, the insulating region 45 refers to a region in which radiation is blocked and heat exchange between a gas and a member is promoted.

A temperature sensor (not shown), which is a temperature detector configured to detect a temperature in the process chamber 44, is installed adjacent to the body to be heated 48. A temperature control unit 52 (see FIG. 5) is electrically connected to the induction coil 50 and the temperature sensor. The temperature control unit 52 adjusts a conduction state to the induction coil 50 based on temperature information detected by the temperature sensor, and controls the conduction state to the induction coil 50 at a desired timing such that the temperature in the process chamber 44 arrives at a desired temperature distribution.

An inner insulating wall 54, which is formed of an insulating material such as a felt-type carbon, is installed between the body to be heated 48 and the reaction tube 42 to prevent an increase in temperature of the reaction tube 42 due to radiation heat radiated from the body to be heated 48 and suppress transfer of radiation heat to the outside of the reaction tube 42. The inner insulating wall 54 is installed to surround an upper portion and an outer circumference of the body to be heated 48, and insulates to prevent heat from escaping from the upper portion of the boat 30, the boat 30, and the lower portion of the boat 30. In addition, in order to suppress transfer of heat in the process chamber 44 to the outside, an outer insulating wall 56, which has a water cooling structure, is installed outside the induction coil 50 to surround the process chamber 44. The outer insulating wall 56 is constituted by, for example, a water cooling plate 56a and a water cooling pipe 56b, and cools the reaction tube 42. Further, a housing cover 58 is installed outside the outer insulating wall 56 to prevent the alternating magnetic field generated by the induction coil 50 from leaking to the outside or prevent heat from leaking to the outside.

(Gas Supply System)

Gas supply nozzles 61 and 62, which are gas flow passages configured to flow a gas through the process chamber 44, are installed at the manifold 46 to pass through the manifold 46. The gas supply nozzles 61 and 62 are constituted by graphite parts 61a and 62a disposed at the wafer region 43 and requiring a relatively high heat resistance, and quartz parts 61b and 62b disposed at the insulating region 45 and having a relatively low heat resistance, which is sufficient to endure the heat. The gas supply nozzles 61 and 62 are formed in, for example, a cylindrical shape. Gas supply pipes 66 and 69 configured to supply gases are connected to the gas supply nozzles 61 and 62 passed through the manifold 46, respectively.

One gas supply pipe 66 is branched into a branch pipe 67 and a branch pipe 68 to be connected to gas supply sources of a carrier and a carbon (C) source (not shown) via valves 72 and 73 and mass flow controllers (MFCs) 76 and 77, respectively, which are gas flow rate control devices. The other gas supply pipe 69 is branched into a branch pipe 70 and a branch pipe 71 to be connected to gas supply sources of a carrier and a silicon (Si) source (not shown) via valves 74 and 75 and MFCs 78 and 79, respectively, which are gas flow rate control devices. A gas flow rate control unit 80 (see FIG. 5) is electrically connected to the valves 72 to 75 and the MFCs 76 to 79, and controls the valves 72 to 75 and the MFCs 76 to 79 at a desired timing such that a flow rate of a supplied gas arrives at a desired flow rate.

A supply hole is formed in the gas supply nozzle 60 to eject a gas to the wafers supported on the boat 30. In addition, the supply hole may be installed in the unit of several wafers.

Five gas supply parts 161 to 165 including the gas supply nozzles 61 and 62 will be described in detail. The gas supply parts 161 to 165 may be simply referred to as a gas supply part 160.

Figure 4:
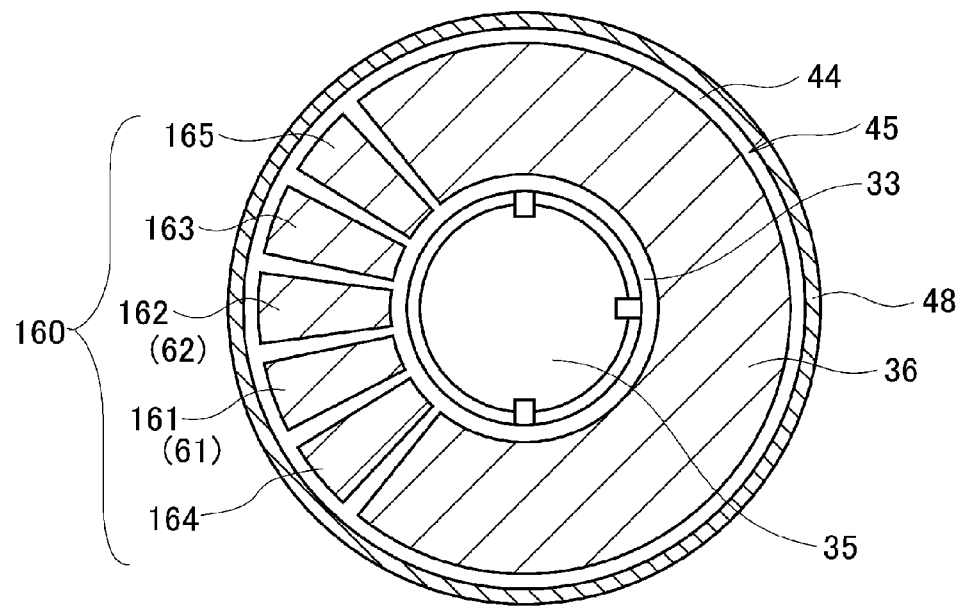
FIG. 4 is a plan cross-sectional view showing a configuration example of the process furnace used in the substrate processing apparatus according to an embodiment of the present invention.

As shown in FIG. 4, the five gas supply parts 161 to 165 are disposed inside the body to be heated 48.

The gas supply part 161 introduces a mixed gas of monosilane ($SiH_4$), which is a Si source, and hydrogen (carrier). In addition, in order to suppress formation of silicon nuclei in a gas phase and improve the quality of crystal, hydrogen chloride (HCl) may be added, or raw materials such as trichlorosilane ($SiHCl_3$) or tetrachlorosilane ($SiCl_4$) containing chlorine (Cl) in its structure may be used. The gas supply part 162 introduces a mixed gas of hydrogen carbonate such as propane ($C_2H_8$) or ethylene ($C_2H_4$), which is a carbon (C) source, and hydrogen. The gas supply part 164 introduces a dopant gas such as nitrogen to form an n-type doped layer. A boron or aluminum compound may be used as the dopant gas to form a p-type doped layer.

In addition, the gases introduced by the gas supply parts 161, 162 and 164 are not limited thereto but may be appropriately varied according to its purpose. As a silicon source, silicon hydride, silicon chloride, silicon hydrogen chloride, or a dilution thereof diluted with hydrogen or argon may be used. These gases for performing processing (epitaxial growth) of the wafer 14 in the process chamber 44 will be referred to as a reaction gas.

Further, the gas supply part 165 introduces an inert gas such as argon. Furthermore, the gas supply part 163 introduces a carrier dopant gas such as nitrogen, trimethyl aluminum (TMA), diborane ($B_2H_6$), or boron trichloride ($BCl_3$).

In the configuration of the process furnace 40, the gas introduced into the process chamber 44 from the gas supply parts 161 to 165 is supplied through a gas supply pipe corresponding to a gas supply source (not shown), flow rate-regulated by an MFC, introduced into the process chamber 44 via a valve, and then ejected between the wafers 14 through supply holes of the gas supply part 160.

(Gas Exhaust System)

In addition, as shown in FIG. 2, a gas exhaust pipe 82 connected to a gas exhaust port 90a is installed at the manifold 46 to pass through the manifold 46. A vacuum exhaust apparatus 86 such as a vacuum pump is connected to a downstream side of the gas exhaust pipe 82 via a pressure sensor (not shown), which is a pressure detector, and an automatic pressure controller (APC) valve 84, which is a pressure regulator. A pressure control unit 98 (see FIG. 5) is electrically connected to the pressure sensor and the APC valve 84. The pressure control unit 98 controls the APC valve 84 at a desired timing, such that the pressure in the process chamber 44 arrives at a desired pressure, by adjusting an opening angle of the APC valve 84 based on the pressure detected by the pressure sensor.

As described above, since the gas ejected through the supply holes of the gas supply part 160 flows between the wafers 14 horizontally held in a vertical direction in a multi-stage manner when the gas flows toward the gas exhaust port 90a, the gas flows parallel to the wafers 14, and the wafers 14 are effectively and uniformly exposed to the gas.

(Bottom Part Structure of Process Furnace)

A seal cap 102, which is a furnace port cover, is installed at a bottom part of the process furnace 40 to hermetically close a lower end opening of the process furnace 40. The seal cap 102 is formed of a metal such as stainless steel, and has a disc shape. An O-ring, which is a seal member, is installed at an upper surface of the seal cap 102 to contact the lower end of the process furnace 40. A rotary mechanism 104 is installed at the seal cap 102. A rotary shaft 106 of the rotary mechanism 104 is connected to the boat 30 through the seal cap 102, and the rotary mechanism 104 rotates the boat 30 to rotate the wafer 14 during processing such that a layer thickness of an epitaxial layer on the wafer 14 is uniformized. The seal cap 102 is moved by an elevation mechanism installed outside the process furnace 40 in a vertical direction (an arrow direction) to load or unload the boat 30 into/from the process furnace 40. A drive control unit 108 (see FIG. 5) is electrically connected to the rotary mechanism 104 and the elevation mechanism, and controls the rotary mechanism 104 and the elevation mechanism to perform a desired operation at a desired timing.

(Control System)

Figure 5:
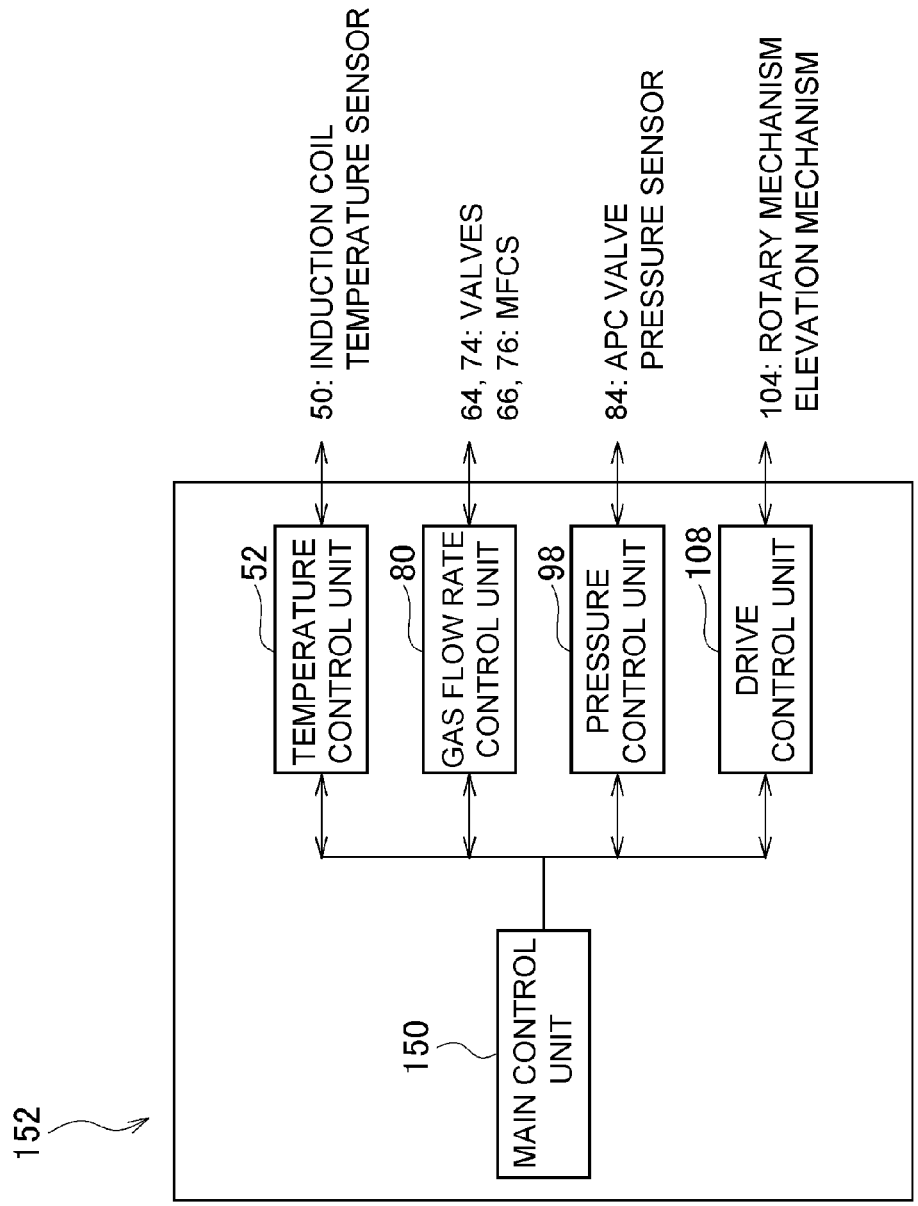
FIG. 5 is a block diagram showing a controller of the substrate processing apparatus according to an embodiment of the present invention.

FIG. 5 shows a control configuration of each part constituting the substrate processing apparatus 10. A controller 152, which is a control unit, includes a temperature control unit 52, a gas flow rate control unit 80, a pressure control unit 98, a drive control unit 108, and a main control unit 150. The main control unit 150 includes an operation unit and an input/output unit, and controls the entire substrate processing apparatus 10. The temperature control unit 52, the gas flow rate control unit 80, the pressure control unit 98, and the drive control unit 108 are electrically connected to the main control unit 150.

(2) Substrate Processing Process (Method of Forming SiC Epitaxial Layer)

Hereinafter, a method of forming a SiC epitaxial layer on a substrate such as a SiC wafer, which is one process of a semiconductor device manufacturing process, using the substrate processing apparatus 10 as described above will be described. In addition, in the following description, an operation of each part constituting the substrate processing apparatus 10 is controlled by the controller 152.

(Wafer Loading Process)

First, the pod 16 in which the plurality of wafers 14 are accommodated is placed on the pod stage 18. Then, the pod conveyance apparatus 20 transfers the pod 16 from the pod stage 18 onto the pod shelf 22. Next, the pod conveyance apparatus 20 conveys the pod 16 placed on the pod shelf 22 to the pod opener 24. Thereafter, the pod opener 24 opens a cover of the pod 16, and the substrate number detector 26 detects the number of the wafers 14 accommodated in the pod 16.

Next, the substrate transfer apparatus 28 extracts the wafers 14 from the pod 16 disposed at a position of the pod opener 24 to transfer the wafers 14 to the boat 30. Accordingly, the boat 30 holds the plurality of wafers 14 in a vertical direction at predetermined intervals. The number of the wafers 14 that are batch-processed is, for example, 25 to 100 sheets. Accordingly, productivity can be improved.

When the plurality of wafers 14 are loaded onto the boat 30, the boat 30 on which the plurality of wafers 14 are held is loaded into the process chamber 44 by an elevation operation (see an arrow of FIG. 2) of the elevation mechanism (boat loading). In this state, the seal cap 102 seals a lower end of the manifold 46 via the O-ring.

(Pressure Regulating Process and Temperature Raising Process)

The vacuum exhaust apparatus 86 vacuum-exhausts the inside of the process chamber 44 to a desired pressure (degree of vacuum). At this time, the pressure in the process chamber 44 is measured by the pressure sensor, and the APC valve 84 corresponding to the gas exhaust pipe 82 is feedback-controlled based on the measured pressure.

In addition, the body to be heated 48 is induction-heated from the outside of the body to be heated 48 by the induction coil 50. Then, the wafers 14 held on the boat 30 and the inside of the reaction chamber 44 are heated to a temperature range, for example, 1500° C. to 1800° C., by radiation heat generated from the body to be heated 48. At this time, a conduction state to the induction coil 50 is feedback-controlled based on temperature information detected by the temperature sensor such that the inside of the process chamber 44 arrives at a desired temperature distribution.

Continuously, the boat 30 is rotated by the rotary mechanism 104, and thus, the wafer 14 is also rotated. Rotation of the wafer 14 is continued until the wafer 14 is unloaded (to be described later).

(Gas Supply Process and Processing Process)

Then, a reaction gas is supplied to the gas supply nozzles 61 and 62, which are representatively described as the gas supply part 160, from a gas supply source (not shown). After adjusting an opening angle of the MFCs 76 to 79 corresponding to the gas supply nozzle 61 and 62 to a desired flow rate, the valves 72 to 75 are opened such that reaction gases pass through the gas supply pipes 66 to 71 to be introduced into the process chamber 44 via the supply holes, respectively. The gases introduced from the gas supply nozzles 61 and 62 mainly pass through a gap 33 between the first heat exchanger 35 and the second heat exchanger 36 via the inside of the body to be heated 48 in the process chamber 44, and are exhausted through the gas exhaust pipe 82. The reaction gases contact the wafer 14 when passing through the process chamber 44, and grow a SiC epitaxial layer on the wafer 14.

(Temperature Lowering Process and Atmospheric Pressure Returning Process)

When a predetermined epitaxial growth time elapses, supply of alternating current to the induction coil is stopped. Then, the temperature of the body to be heated 48, the boat 30 and the wafer 14 is lowered to a predetermined temperature (for example, about 600° C.).

In addition, when a predetermined time elapses, the valves 72 to 75 are closed to stop supply of the gas into the process chamber 44, and supply of an inert gas into the process chamber 44 from an inert gas supply source (not shown) is initiated. Accordingly, the inside of the process chamber 44 is substituted with an inert gas, and the pressure in the process chamber 44 is returned to a normal pressure.

(Wafer Unloading Process)

Thereafter, the elevation mechanism lowers the seal cap 102 to open the lower end of the manifold 46, and the boat 30 on which the processed wafers 14 are held is unloaded from the lower end of the manifold 46 to the outside of the reaction tube 42 (boat unloading). Then, the boat 30 is on standby at a predetermined position until all the wafers 14 supported on the boat 30 are cooled. When the wafers 14 on the boat 30 on standby are cooled to a predetermined temperature (for example, about room temperature), the substrate transfer apparatus 28 extracts the wafers 14 from the boat 30 and conveys the wafers 14 to the empty pod 16 placed on the pod opener 24 to accommodate the wafers 14 therein. Then, the pod conveyance apparatus 20 conveys the pod 16 in which the wafers 14 are accommodated onto the pod shelf 22 or the pod stage 18. As a result, the series of processing operations of the substrate processing process by the substrate processing apparatus 10 according to the embodiment are completed.

(3) Insulating Structure of Furnace Port Part>

Hereinafter, an insulating structure of the furnace port part, which is a characteristic configuration of the substrate processing apparatus 10 according to the embodiment, will be described.

Figure 6:
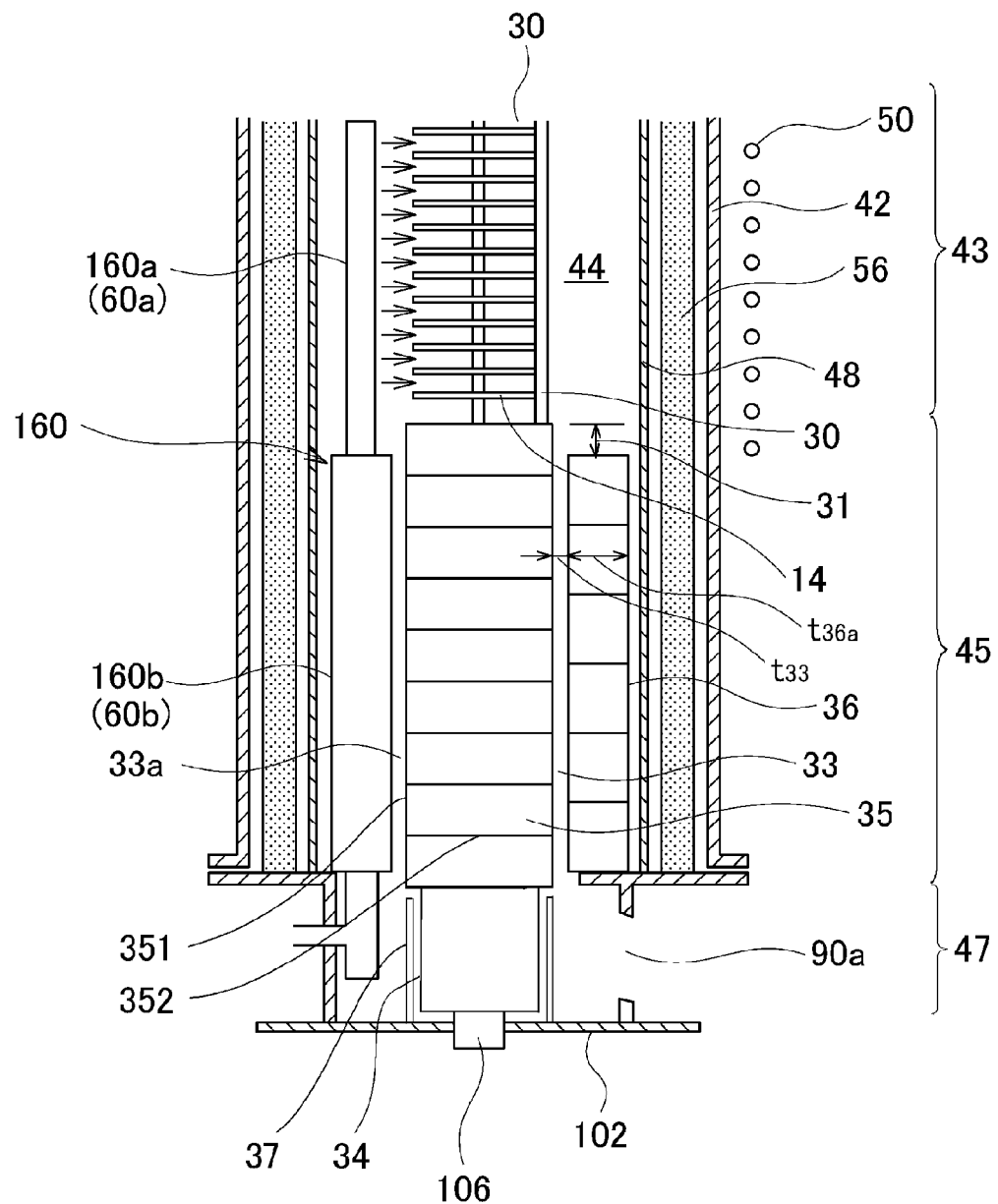
FIG. 6 is a vertical cross-sectional view showing a configuration example of a lower structure of the process furnace used in the substrate processing apparatus according to an embodiment of the present invention.
Figure 7:
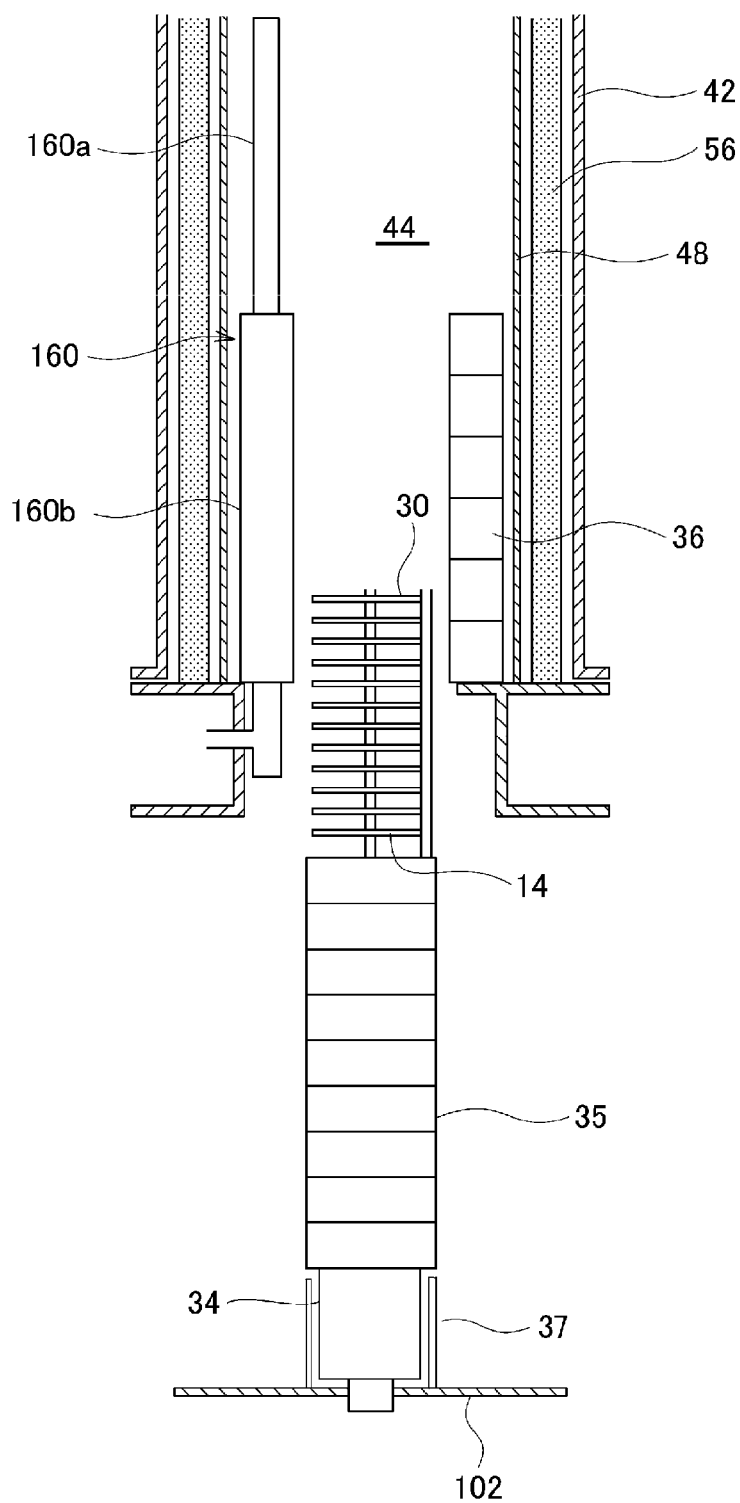
FIG. 7 is a vertical cross-sectional view showing a configuration example of the process furnace when a boat is loaded into or unloaded from the substrate processing apparatus according to an embodiment of the present invention.

FIG. 6 is a vertical cross-sectional view showing a configuration example of the lower structure of the process furnace 40. FIG. 7 is a vertical cross-sectional view showing a configuration example of the process furnace 40 when loading and unloading of the boat 30 are performed.

As described above, the wafer region 43 in which the wafers 14 are heat-treated is formed in the process chamber 44 of the process furnace 40. The wafer region 43 is maintained at a temperature of 1500° C. to 1800° C., which is an epitaxial growth temperature, during epitaxial growth. A furnace port part 47 is provided at a lower side of the wafer region 43. Here, the furnace port part 47 refers to an aperture formed at the manifold 46, and includes, for example, a lower end aperture (a lower aperture of the process chamber) or the gas exhaust port 90a of a side surface.

However, upon the epitaxial growth, a temperature of the furnace port part 47 is raised by strong radiation heat from the wafer region 43. Further, in general, since a large amount of carrier gas is needed for epitaxial growth of SiC, transportation of heat energy from the wafer region 43 to the furnace port part 47 is also remarkably increased similar to the above description.

Meanwhile, a heat-resistant temperature of the O-ring, which is used as a vacuum seal at the furnace port part 47, is for example about 300° C. at the most. In addition, a heat-resistant temperature of a magnetic fluid, which is used as a sealing material at a bearing part of the rotary shaft 106 of the rotary mechanism 104, is for example about 100° C.

For this reason, in order to protect the O-ring and the magnetic fluid, it is necessary to maintain each temperature in the furnace port part 47 less than the heat-resistant temperature using any method.

Therefore, the substrate processing apparatus 10 according to this embodiment includes, as shown in FIG. 6, the insulating region 45 between the wafer region 43 and the furnace port part 47 to maintain the furnace port part 47 at a temperature equal to or lower than the heat-resistant temperature.

A heat exchange system, which is a structure for preventing transfer of heat of the wafer region 43 to the furnace port part 47 (hereinafter, simply referred to as an insulating structure), is disposed in the insulating region 45. The heat exchange system blocks radiation from the wafer region 43, and simultaneously actively performs heat exchange with the high temperature gas. Accordingly, the gas from the wafer region 43 can be sufficiently cooled before arrival at the furnace port part 47.

In addition, an insulating system is disposed at a lower side of the heat exchange system as another one of the insulating structures. The insulating system performs insulation of heat from the wafer region 43. Accordingly, the heat from the wafer region 43 may not be transferred to the bearing part of the rotary shaft 106 using, in particular, a magnetic fluid. That is, when the rotary shaft 106 of the furnace port part 47 is in an exposed state, the temperature may be increased due to exposure to the high temperature carrier gas as well as heat from an upside caused by radiation. However, by installing the insulating system at the insulating region 45, the magnetic fluid used as a sealing material of the rotary shaft 106 can be maintained at a temperature equal to or lower than the heat-resistant temperature (for example, about 100° C.).

Hereinafter, these insulating structures will be sequentially described.

(Heat Exchange System)

A heat exchange system includes the first heat exchanger 35 and the second heat exchanger 36. Both of the first heat exchanger 35 and the second heat exchanger 36 are constituted by a member (for example, carbon) that can endure a high temperature of 1500° C. to 1800° C.

The first heat exchanger 35 is disposed under (for example, directly beneath) the boat 30. The first heat exchanger 35 is configured to support the boat 30 from a lower side of the boat 30 at the insulating region 45 between the wafer region 43 in the process chamber 44 and the furnace port part 47, perform heat exchange with the gas flowing from the wafer region 43 in the process chamber 44 toward the furnace port part 47 disposed at a lower side thereof, and make it difficult to transfer the heat of the gas to the manifold 46 (furnace port part 47).

For this reason, the first heat exchanger 35 includes a hollow cylindrical insulating tube 351 vertically extending in a gas flowing direction and an insulating plate 352 installed in the insulating tube 351. The insulating tube 351 has a tube shape (i.e., a cylindrical shape) having a circular cross-section to correspond to the wafers 14 held on the boat 30. In addition, the insulating plate 352 is constituted by a plurality of disc members, which are horizontally disposed. Further, in the substrate processing apparatus, the insulating plate 352 includes a through-hole or a gap between the insulating plate 352 and a sidewall of the insulating tube 351, and regions over and under the insulating plate 352 in the insulating tube 351 are spatially connected to each other with the gap therebetween.

When the first heat exchanger 35 is disposed at the insulating region 45, the gas flows along a tube outer surface of the first heat exchanger 35, and during the process, the gas flowing outside the tube is heat-exchanged with the region in the tube to be cooled until the high temperature gas arrives at the furnace port part 47 disposed at the lower side of the process chamber 44. In addition, the insulating plate 352 is installed in the insulating tube 351 to suppress heat transfer by radiation from the wafer region 43. Accordingly, heat deterioration of the member constituting the furnace port part 47 disposed at the lower side of the process chamber 44 can be suppressed. Further, since the regions over and under the insulating plate 352 are spatially connected to each other, a pressurized state of the regions in the tube of the first heat exchanger 35 after the heat exchange can be suppressed to maintain the decompressed state, and thus, the regions can be prevented from becoming a contamination source of the remaining air, and so on.

The second heat exchanger 36 is disposed outside the first heat exchanger 35. The second heat exchanger 36 is installed in the process chamber 44 to be parallel to the first heat exchanger 35 and spaced apart from the first heat exchanger 35 by a certain gap, and perform heat exchange through the gap with the gas flowing from the wafer region 43 toward the furnace port part 47 disposed at the lower side.

Because the second heat exchanger 36 is installed, heat exchange of the gas flowing from the wafer region 43 to the furnace port part 47 with the first heat exchanger 35 is promoted. That is, the gas introduced from the gas supply nozzles 61 and 62 passes through the wafer region 43, flows to the furnace port part 47 via the gap between the first heat exchanger 35 and the second heat exchanger 36, and is exhausted through the furnace port part 47. At this time, since the second heat exchanger 36 is installed to narrow a gas flow path, efficiency of the heat exchange with the first heat exchanger 35 can be improved, and heat of the gas cannot be easily transferred to the manifold 46 (furnace port part 47).

While the first heat exchanger 35 and the second heat exchanger 36 installed at the insulating region 45 function as a heat exchanger configured to perform heat exchange with the gas flowing from the wafer region 43 to the furnace port part 47, the first heat exchanger 35 and the second heat exchanger 36 may be constituted by an insulating member to function as an insulating part to insulate the wafer region 43 from the furnace port part 47.

Meanwhile, in this embodiment, insulation of the wafer region 43 from the furnace port part 47 is needed to protect the furnace port part 47 from a large amount of heat radiation emitted from the wafer region 43. In order to increase an insulating effect, an insulating material having good insulating efficiency may be used or a height of the insulating part in a vertical direction may be increased.

On the other hand, prevention of transportation of a large amount of heat energy from the wafer region 43 to the furnace port part 47 by the gas discharged from the furnace port part 47 is needed. In order to effectively suppress the transportation of the heat energy, a portion of the gas flow path may be buried by an insulating material to narrow the gas flow path, and heat exchange between the insulating material and the gas may be performed to take heat from the gas.

For this reason, when the first heat exchanger 35 and the second heat exchanger 36 are installed, a heat exchange area between the gas and the first and second heat exchangers 35 and 36 may be increased and a cross-sectional area of the flow path through which the gas passes may be reduced.

Here, in the wafer region 43, in order to improve uniformity of the gas flow, the gas flow path may be expanded. Accordingly, in this embodiment, the second heat exchanger 36 is disposed at a position lower than the wafer region 43 such that a horizontal cross-sectional area of the gas flow path in the region in which the first heat exchanger 35 and the second heat exchanger 36 are disposed is smaller than that of the gas flow path in the wafer region 43.

While the first heat exchanger 35 and the second heat exchanger 36 may have a solid column shape, for example, in which a region of the tube is filled with a certain member, a hollow shape is preferable in consideration of an insulating effect. When the first heat exchanger 35 and the second heat exchanger 36 have a hollow tube shape, a structure may be provided to prevent the gas from entering the hollow tube. In addition, while the region in the hollow tube may be considered not to form a partition wall such that the inside of the hollow tube forms a single space, in order to block a larger amount of radiation heat, a plurality of partition walls may be installed to form a plurality of partitioned spaces in a vertical direction. In this case, the partition wall and the hollow tube may be formed integrally with each other or may be formed separately from each other. When formed separately from each other, a plurality of heat exchange bodies may be stacked to form a plurality of partitioned spaces in the vertical direction, and the stacked bodies may refer to the first heat exchanger 35 or the second heat exchanger 36. The heat exchange body may have, for example, a rectangular cross-section, a U-shaped cross-section, or a substantially C-shaped cross-section.

Further, in the second heat exchanger 36, the following configuration of a plan shape may be considered from relationship with the gas supply part 160. That is, as shown in FIG. 4, the second heat exchanger 36 has an inverted C-shaped cross-section to bury a position at which the gas supply part 160 is not formed. More specifically, the five gas supply parts 161 to 165 are concentrated at a planar ring-shaped region formed between the body to be heated 48 and the first heat exchanger 35, and a portion of the space is buried into a fan shape. As a result, when the planar fan-shaped gas supply part 160 is constituted by the five gas supply parts 161 to 165, the second heat exchanger 36 is disposed to form an inverse C-shape to bury the other portions of the planar ring-shaped space. In this case, the second heat exchanger 36 covers the entire insulating region 45, except for the gas supply part 160 around a horizontal side of the first heat exchanger 35 at the lower side of the boat.

(Insulating System)

The insulating system includes a lower insulating part 34 and an insulating ring 37. The lower insulating part 34 and the insulating ring 37 are made of a material having a thermal conductivity less than the first heat exchanger 35. For example, when the first heat exchanger 35 is formed of a heat-resistant material such as graphite (C) or silicon carbide (SiC), quartz, which has a thermal conductivity lower than that of the heat-resistant material, may be used as the material. Even when the high temperature carrier gas of 1500° C. to 1800° C. flows from the wafer region 43, since the temperature of the gas is substantially decreased by the heat exchange with the first heat exchanger 35, the lower insulating part 34 and the insulating ring 37 may be made of a material having good insulating performance such as quartz.

The lower insulating part 34 is disposed under the first heat exchanger 35. The lower insulating part 34 includes a plurality of plate members 341 stacked in a vertical direction, and a column member 342 configured to support the plurality of plate members 341. According to the configuration, the lower insulating part 34 reflects heat radiation using the plurality of plate members 341 in a multi-stage manner, holds heat energy in the process chamber 44, and effectively protects the furnace port part 47 (in particular, the rotary shaft 106 using a magnetic fluid) having a low insulating property from the radiation.

The insulating ring 37 projects from an upper surface of the seal cap 102 toward the first heat exchanger 35 to surround a side portion of the lower insulating part 34. In addition, a horizontal diameter of the insulating ring 37 is equal to or smaller than that of the first heat exchanger 35. That is, the diameter of the insulating ring 37 is equal to a diameter of an outer circumference of the first heat exchanger 35 or smaller than the diameter of the outer circumference. According to the configuration, the gas flowed along an outer sidewall of the first heat exchanger 35 is prevented from flowing toward a side of the inner circumference of the insulating ring 37, i.e., a side at which the rotary shaft 106 is disposed so that the insulating ring 37 effectively suppresses an increase in temperature near the rotary shaft 106.

(Processing Operation Upon Epitaxial Growth)

Hereinafter, a processing operation of the above configuration upon epitaxial growth will be described.

As shown in FIG. 7, upon loading or unloading of the wafer performed before epitaxial growth, the first heat exchanger 35, the lower insulating part 34 and the insulating ring 37 are vertically operated with the boat 30. At this time, the second heat exchanger 36 is on standby in the process chamber 44.

When the epitaxial growth is performed as one process of the method of manufacturing a semiconductor device, the boat 30 fixed onto the seal cap 102 and on which the plurality of SiC wafers 14 are mounted is loaded into the process chamber 44 by the elevation mechanism, and the space of the process chamber is sealed. Then, as an inert gas (for example, Ar) is introduced into the furnace, the vacuum exhaust apparatus 86 connected to the process chamber via the APC valve 84 exhausts the space of the process chamber to a desired pressure. In addition, high frequency power (for example, 10 to 100 kHz, 10 to 200 kW) is applied to the induction coil 50 installed at the outer circumference of the process chamber, over-current is generated from the cylindrical body to be heated 48, and the body to be heated 48 is heated to a desired processing temperature (1500° C. to 1800° C.) by Joule heat. As a result, the SiC wafer 14, the wafer holder 15 and the boat 30 disposed inside the process chamber, compared to the body to be heated 48 are heated to a temperature equal to the temperature of the body to be heated 48 by radiation heat radiated from the body to be heated 48.

Next, as a Si-based raw material (in the drawings, $SiCl_4$, $SiH_4$, TCS, DCS, and so on) mixed with the carrier gas from the gas supply nozzle 60 and a carbon-based material (in the drawings, $C_3H_8$, $C_2H_4$, and so on) are supplied to the SiC wafer 14 maintained at the processing temperature (1500° C. to 1800° C.), the inside of the process chamber is controlled to a desired pressure by the APC valve 84 to perform SiC epitaxial growth. During the growth, in order to secure uniformity within the wafer surface, the boat 30 is rotated by the rotary shaft 106.

The high temperature gas supplied for processing of the SiC wafer 14 flows from the wafer region 43 to the furnace port part 47 through the gap between the first heat exchanger 35 and the second heat exchanger 36 to be exhausted through the gas exhaust pipe 82 connected to the gas exhaust port 90a. At this time, the gas flowing from the wafer region 43 to the furnace port part 47 loses heat by heat exchange between the first heat exchanger 35 and the second heat exchanger 36. That is, in a state in which the gas flowing from the wafer region 43 to the furnace port part 47 is in contact with the outer circumference of the first heat exchanger 35 and the inner circumference of the second heat exchanger 36, the heat of the corresponding gas moves by heat exchange at a space in the tube of the first heat exchanger 35 and a space in the tube of the second heat exchanger 36. Accordingly, the temperature of the gas introduced into the furnace port part 47 can be decreased, and thus, heat deterioration of the member at the lower side of the process chamber can be suppressed.

The heat taken from the gas by the heat exchange between the first heat exchanger 35 and the second heat exchanger 36 is accumulated in the spaces in the tubes of the first heat exchanger 35 and the second heat exchanger 36. In addition, in a temperature lowering process after lapse of the epitaxial growth time, the first heat exchanger 35 and the second heat exchanger 36 emit heat radiation toward the outer circumference of the second heat exchanger 36, i.e., a side portion of the process chamber 40, and then prepare for heat exchange to be performed later.

As the heat exchange system constituted by the first heat exchanger 35 and the second heat exchanger 36 is provided, in the substrate processing apparatus 10 according to this embodiment, heat exchange at the lower side in the process chamber 44 can be promoted, and heat deterioration of the member at the lower side of the process chamber 44 can be suppressed. That is, near the furnace port part 47 at the lower side of the process chamber 44, the temperature of the gas can be maintained at a low level (for example, about 200° C.) by heat exchange performed by the heat exchange system, and the seal member (O-ring) can be protected from the heat.

In addition, since a horizontal width of the process chamber 44 can be configured to be substantially larger than the wafer 14, productivity can be improved, and heat treatment uniformity between the wafers 14 and in the surface of the wafer 14 can be improved.

Further, as the insulating system constituted by the lower insulating part 34 and the insulating ring 37 is provided, in the substrate processing apparatus 10 according to this embodiment, even when the first heat exchanger 35 is heated to a high temperature by the heat exchange with the gas in the process chamber 44 as well as the heat from the wafer region 43, the heat is insulated by the lower insulating part 34. Accordingly, the heat cannot be maximally transferred to the furnace port part 47 disposed at the lower side of the process chamber 44, in particular, the bearing part of the rotary shaft 106 using a magnetic fluid. Further, since introduction of the gas lowered along the first heat exchanger 35 into the insulating ring 37 can be suppressed by the presence of the insulating ring 37, heat deterioration of the member constituting the furnace port part 47 (in particular, the bearing part of the rotary shaft 106) can be suppressed. That is, when the rotary shaft 106 of the furnace port part 47 is in an exposed state, while the temperature may be increased by exposure to the high temperature carrier gas as well as the heat from the upper side due to radiation, the magnetic fluid used as a sealing material of the rotary shaft 106 can be maintained at a temperature equal to or lower than the heat-resistant temperature (for example, about 100° C.) by installing the insulating system at the insulating region 45.

(4) One Specific Example of Insulating Structure

Hereinafter, the insulating structure constituted by the heat exchange system and the insulating system will be described with reference to a specific example in detail.

(First Heat Exchanger)

Figure 8:
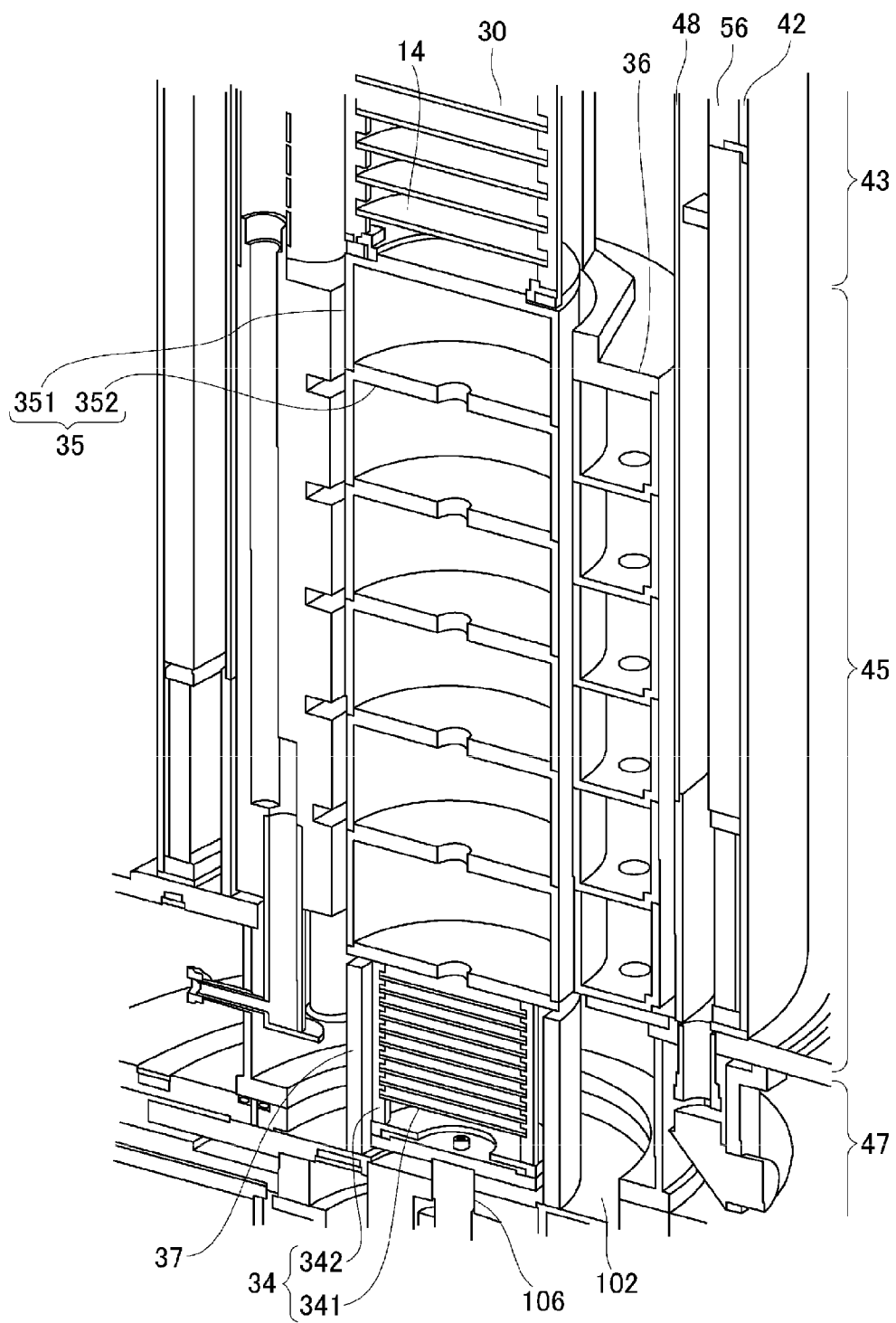
FIG. 8 is a perspective cross-sectional view showing a detailed configuration example of a lower structure of the process furnace used in the substrate processing apparatus according to an embodiment of the present invention.
Figure 9:
FIG. 9 is a view for explaining a specific example of an insulating tube constituting a first heat exchanger of the process furnace used in the substrate processing apparatus according to an embodiment of the present invention.
Figure 10:
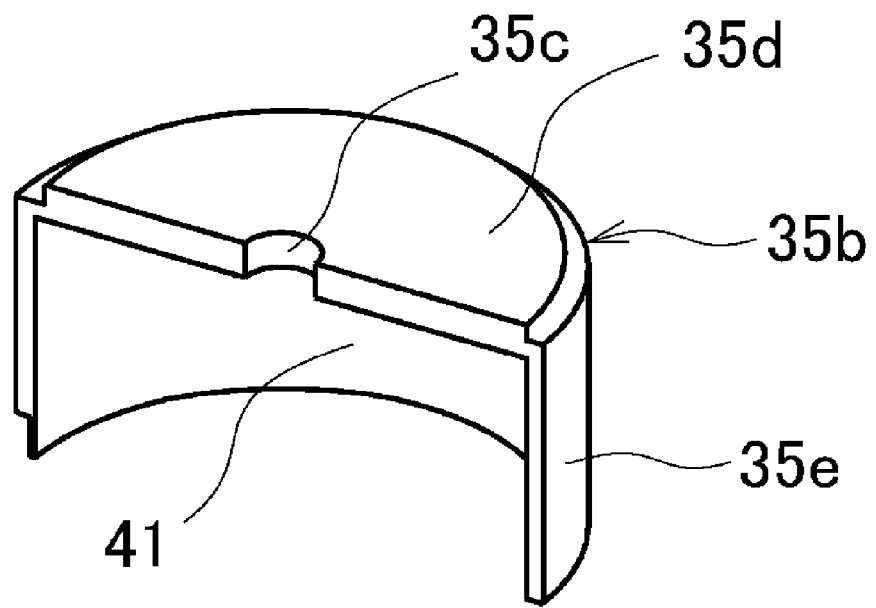
FIG. 10 is a perspective view showing a specific example of a tubular member constituting the first heat exchanger of the process furnace used in the substrate processing apparatus according to an embodiment of the present invention.
Figure 11A:
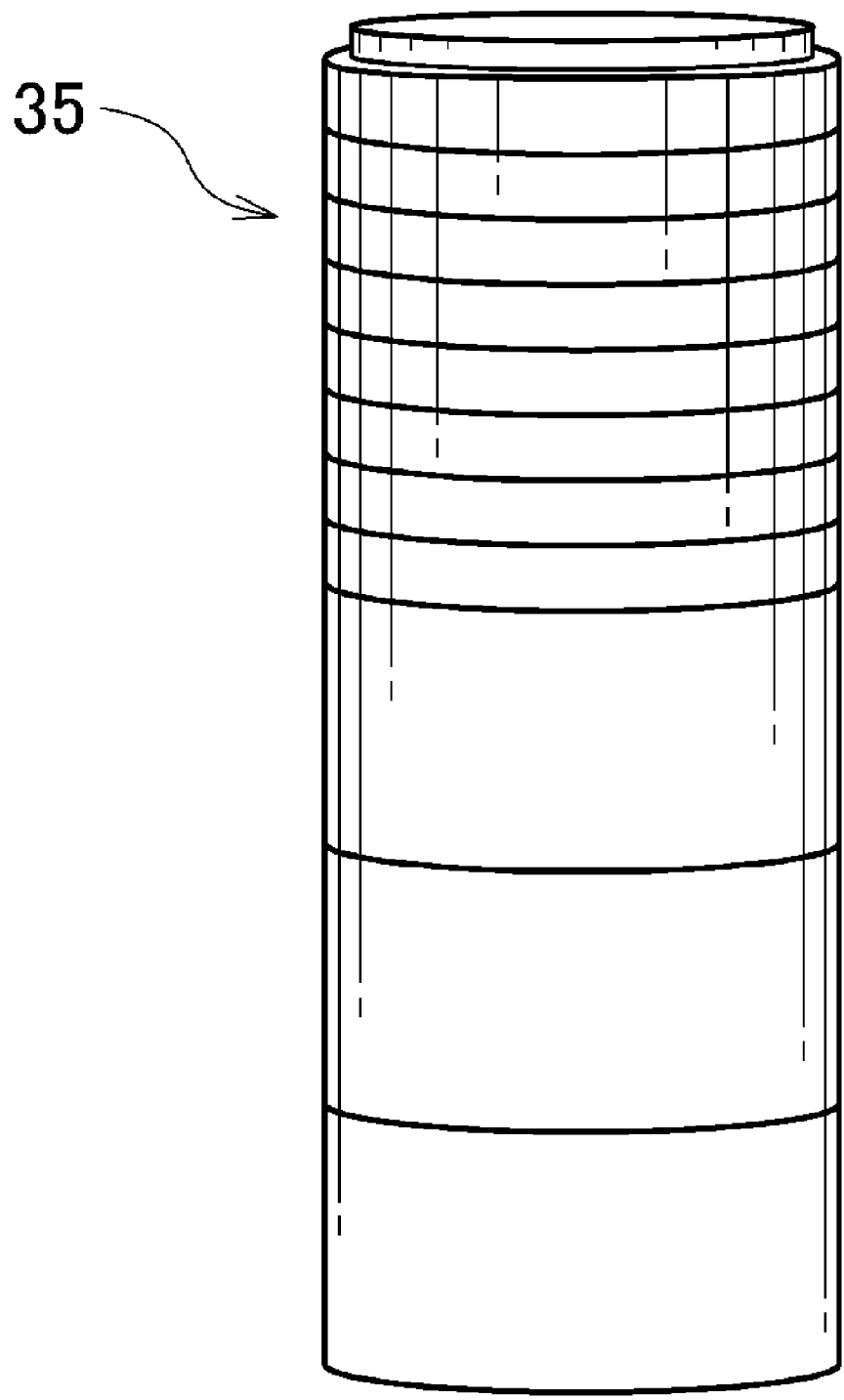
FIG. 11 is a view for explaining a first variation of disposition of the tubular member of the first heat exchanger of the process furnace used in the substrate processing apparatus according to an embodiment of the present invention, FIG. 11A showing a perspective view thereof and FIG. 11B showing a vertical cross-sectional view thereof.
Figure 11B:
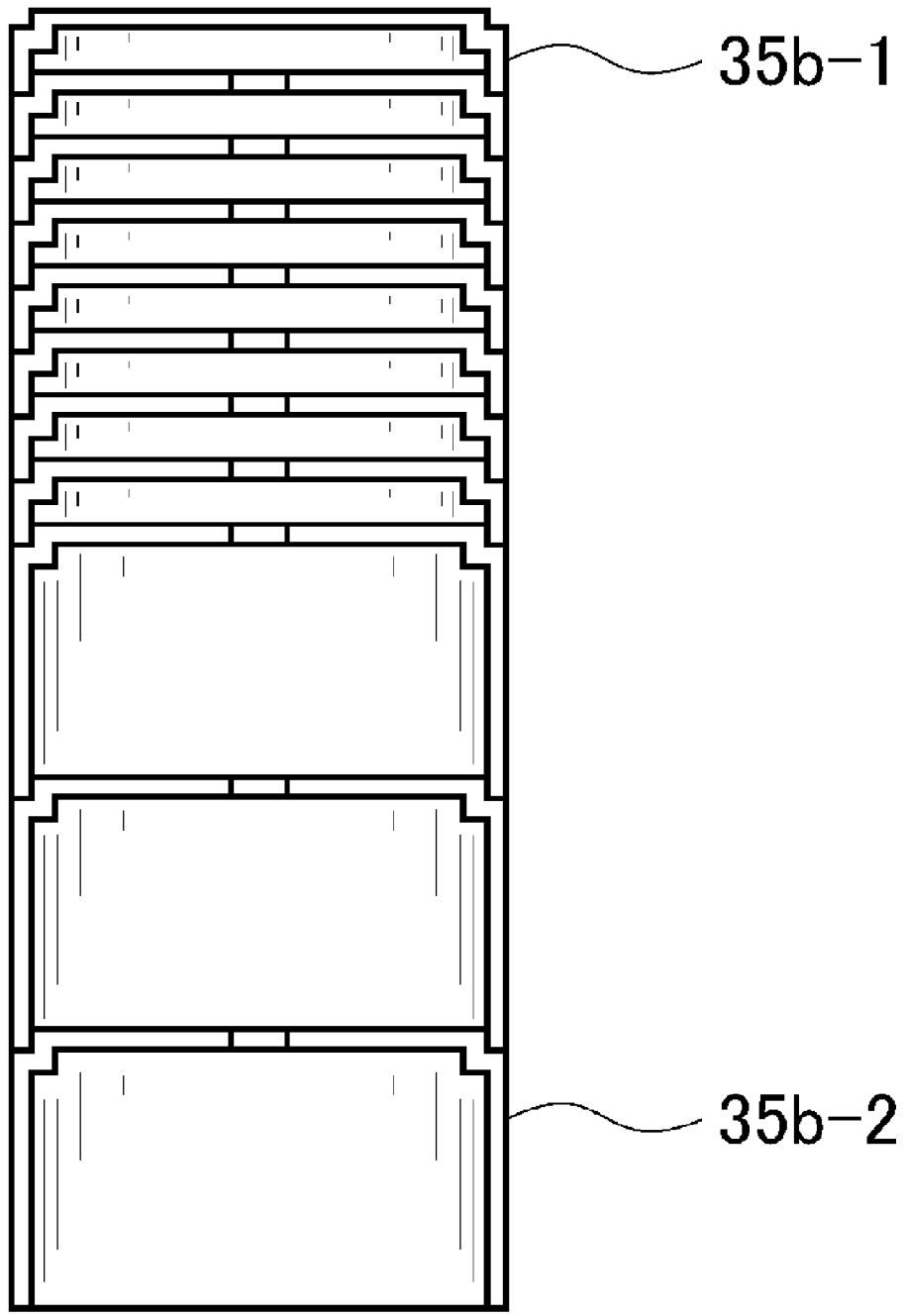
Figure 12A:
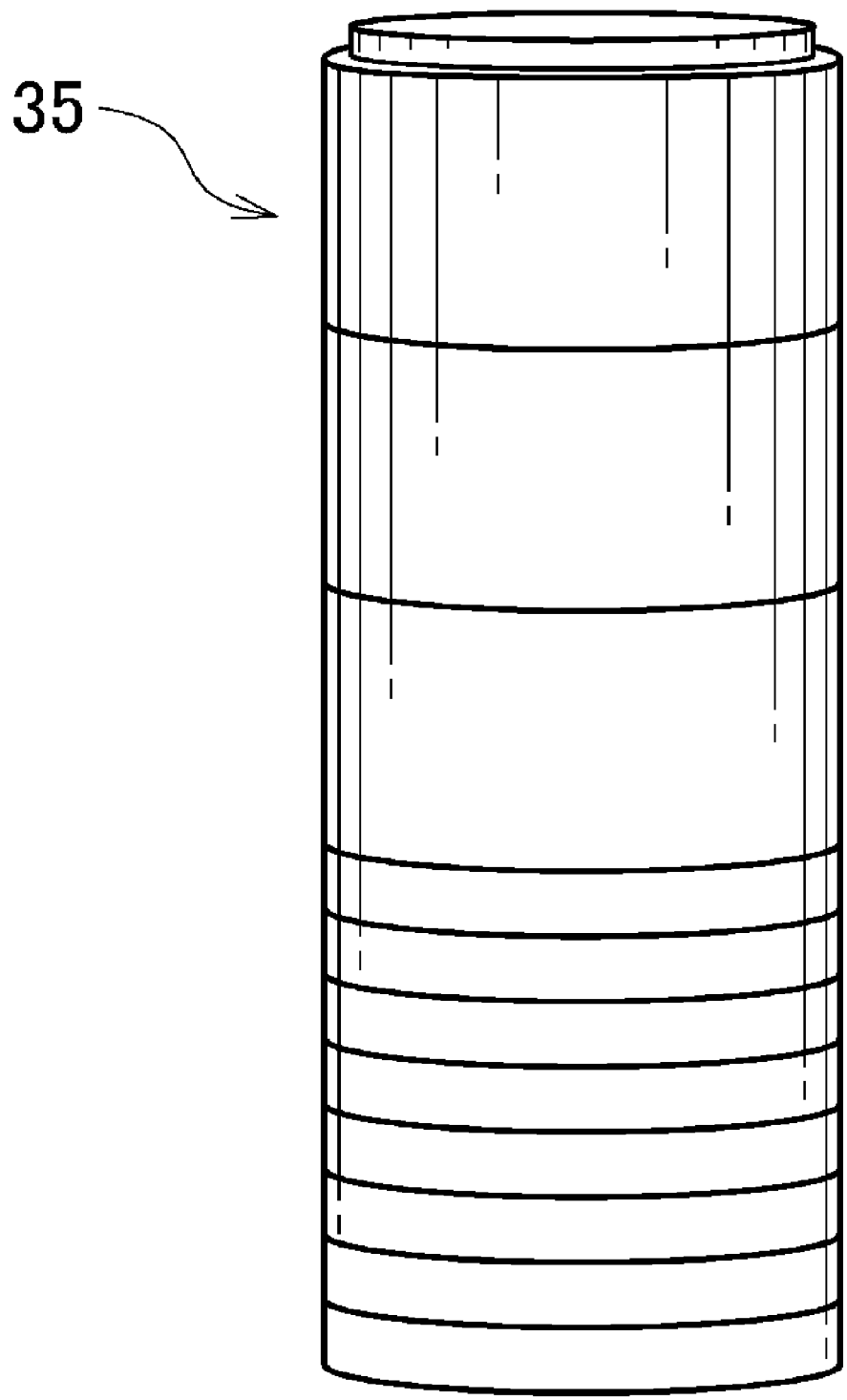
FIG. 12 is a view for explaining a second variation of disposition of the tubular member of the first heat exchanger of the process furnace used in the substrate processing apparatus according to an embodiment of the present invention, FIG. 12A showing a perspective view thereof and FIG. 12B showing a vertical cross-sectional view thereof.
Figure 12B:
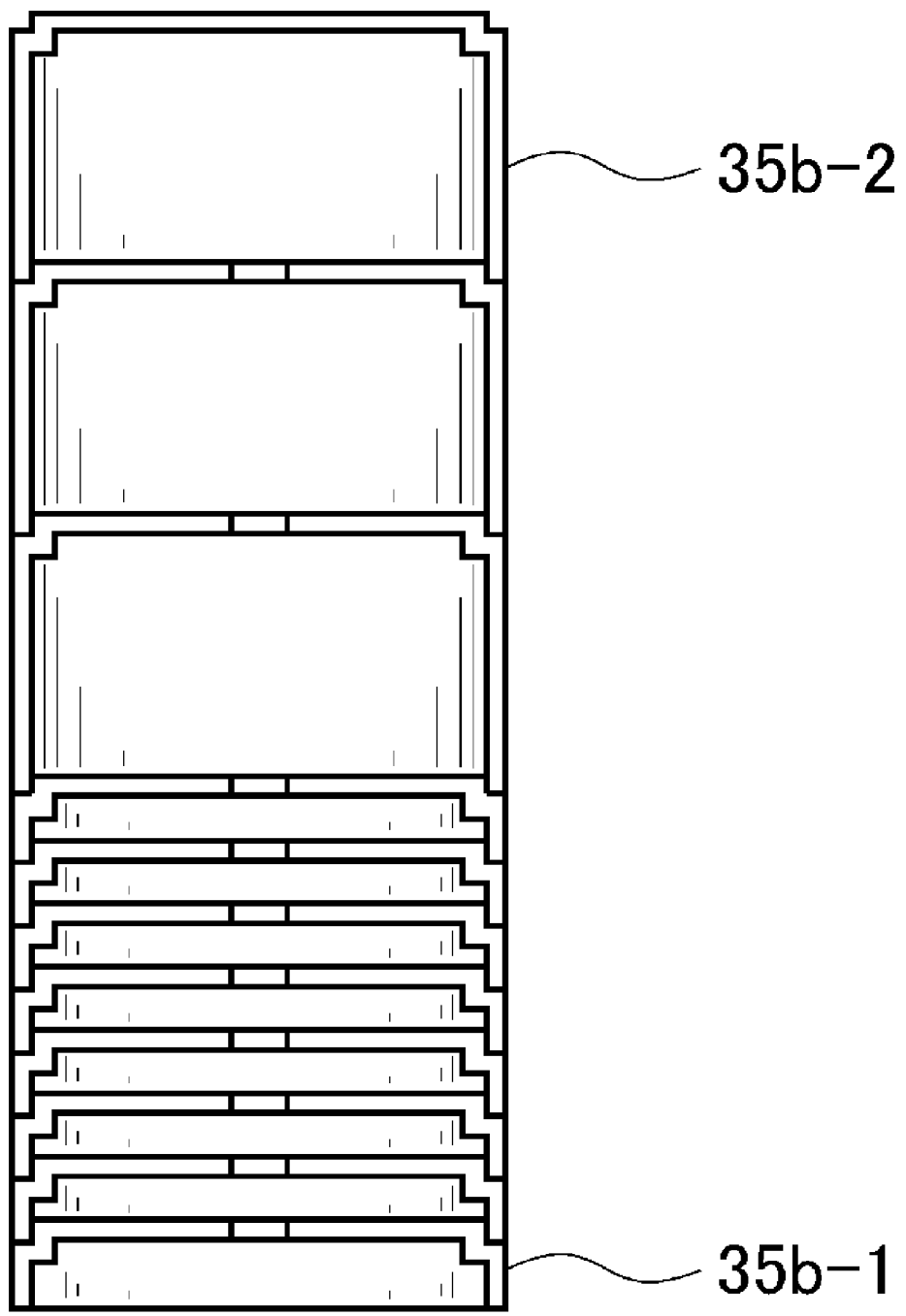
Figure 13A:
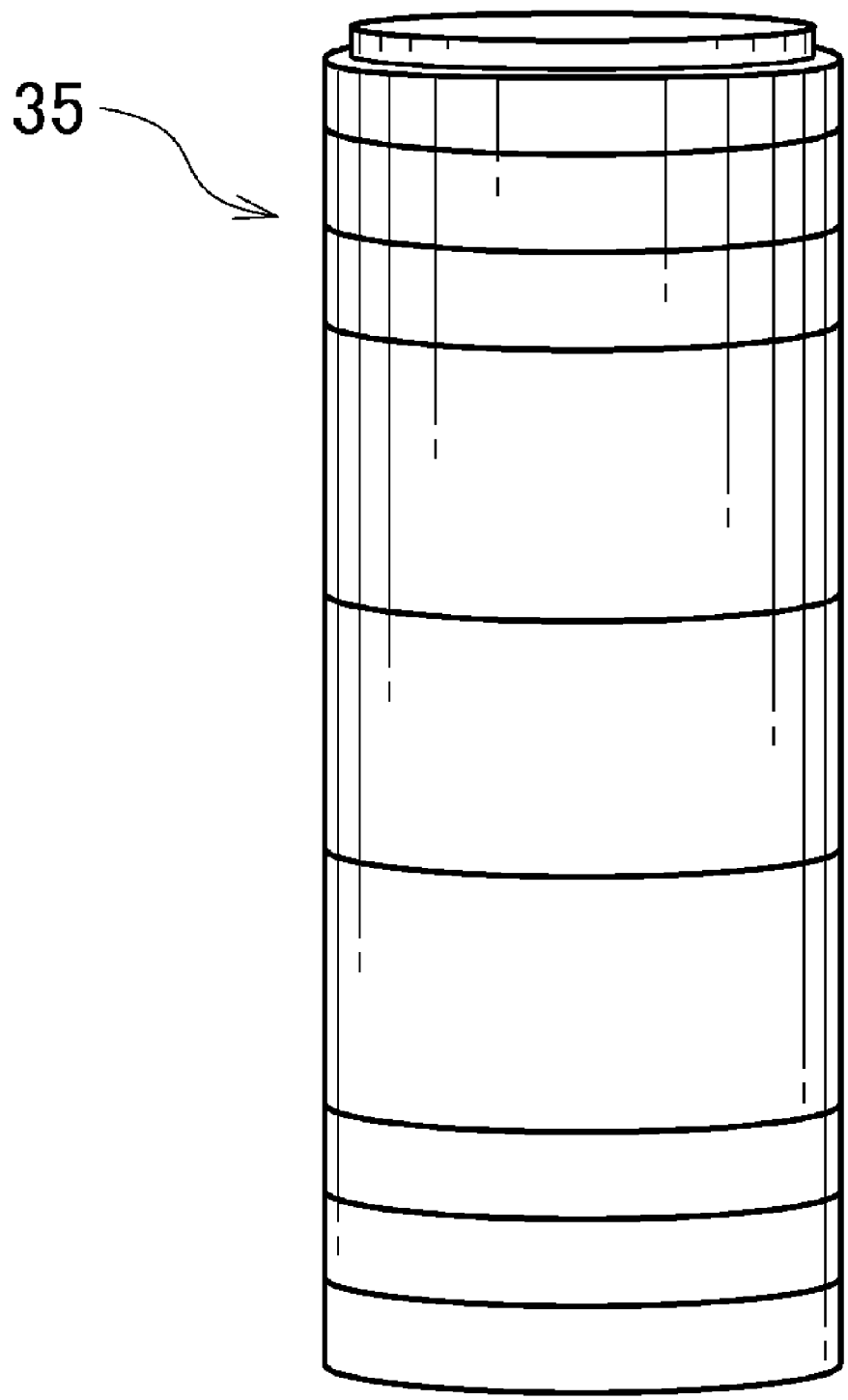
FIG. 13 is a view for explaining a third variation of disposition of the tubular member of the first heat exchanger of the process furnace used in the substrate processing apparatus according to an embodiment of the present invention, FIG. 13A showing a perspective view thereof and FIG. 13B showing a vertical cross-sectional view thereof.
Figure 13B:
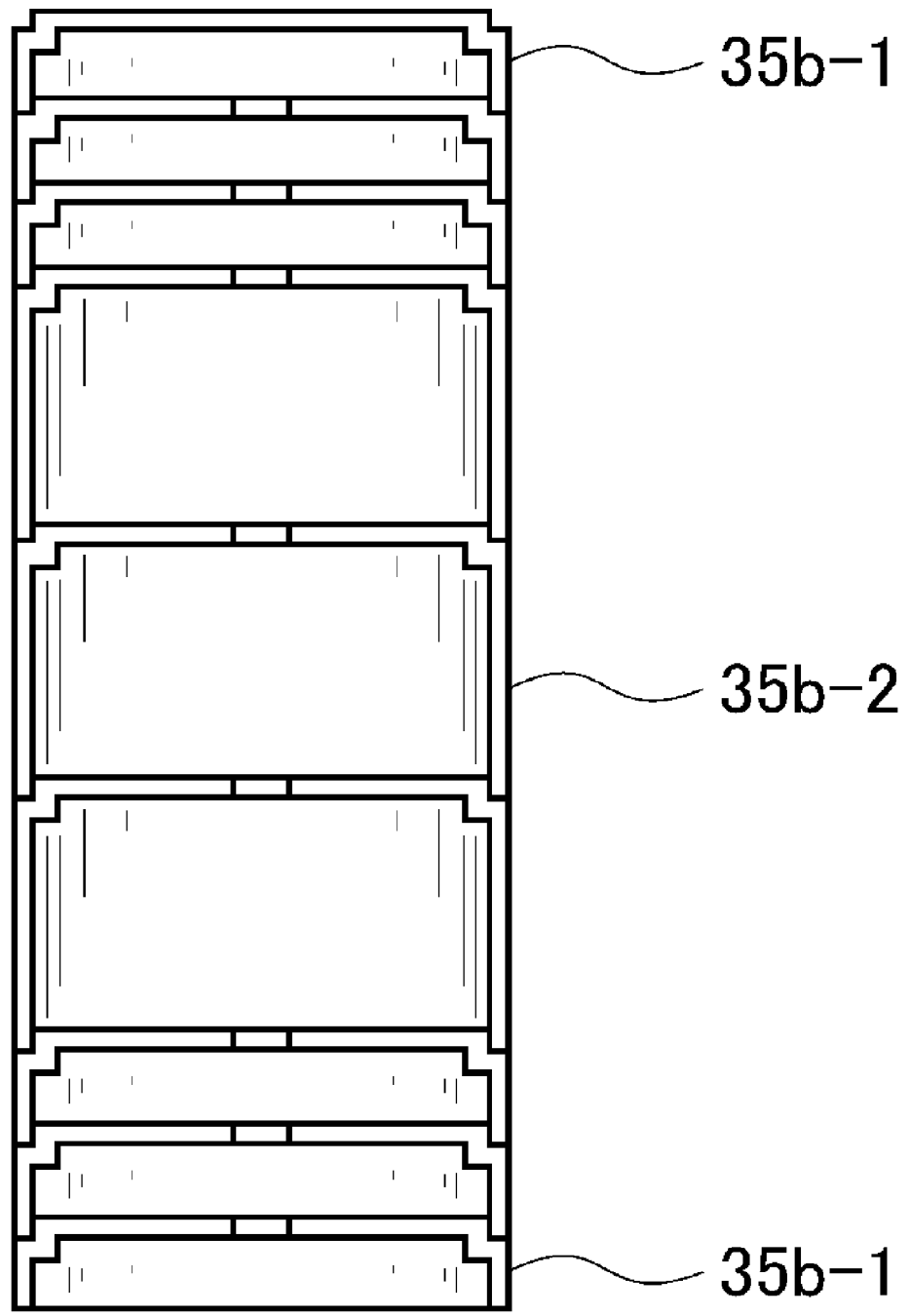
Figure 14A:
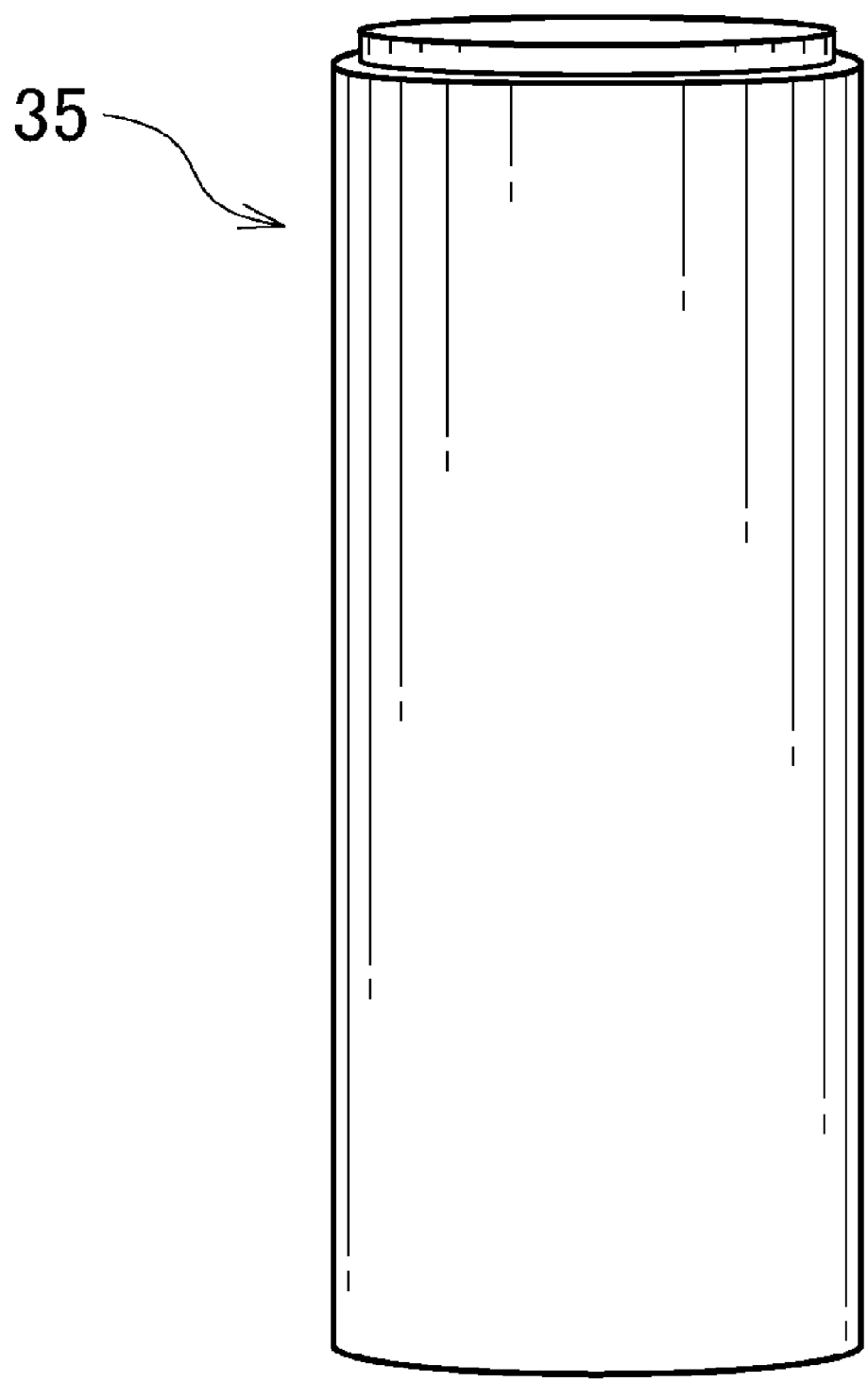
FIG. 14 is a view for explaining another configuration example of the first heat exchanger of the process furnace used in the substrate processing apparatus according to an embodiment of the present invention, FIG. 14A showing a perspective view thereof and FIG. 14B showing a vertical cross-sectional view thereof.

FIG. 8 is a perspective cross-sectional view specifically showing a configuration example of the lower structure of the process furnace 40. FIG. 9 is a view for explaining a specific example of the insulating tube 351 constituting the first heat exchanger 35. FIG. 10 is a perspective view showing a specific example of a cylindrical member 35b constituting the first heat exchanger 35. FIG. 11 is a view for explaining a first variation of a disposition of the cylindrical member 35b. FIG. 12 is a view for explaining a second variation of the disposition of the cylindrical member 35b. FIG. 13 is a view for explaining a third variation of the disposition of the cylindrical member 35b. FIG. 14 is a view for explaining another configuration example of the first heat exchanger 35.

As shown in FIGS. 6 and 8, the first heat exchanger 35 includes the hollow cylindrical insulating tube 351 vertically extending in the gas flowing direction, and the insulating plate 352 installed in the insulating tube 351, wherein regions in the insulating tube 351 over and under the insulating plate 352 are spatially connected to each other. Accordingly, when there is a difference between the temperature of the gas introduced from the wafer region 43 and the temperature of the space in the insulating tube 351, heat exchange is performed through the medium of the sidewall of the insulating tube 351 to cool the gas. Therefore, since a bad effect due to the heat from the wafer region 43 to the furnace port part 47 can be reduced, the substrate can be stably processed while suppressing heat deterioration of the member at the lower side of the process chamber. In order to promote the heat exchange, a contact area between the gas from the wafer region 43 and the outer surface of the insulating tube 351 may be increased. For this reason, specifically, within a possible limitation in consideration of the size of the process furnace 40, an increase in tube length and tube diameter of the insulating tube 351 may be considered.

In addition, the inside of the insulating tube 351 of the first heat exchanger 35 is divided into a plurality of spaces by the insulating plates 352. For this reason, since heat transfer by radiation from the wafer region 43 is suppressed, heat deterioration of the member at the lower side of the process chamber can be suppressed.

Further, since the insulating tube 351 is divided into the plurality of spaces, generation of convection in the insulating tube 351 is suppressed. That is, heat exchange between the plurality of divided spaces is also performed. Accordingly, upon heat exchange with the gas from the wafer region 43, a temperature distribution in which temperatures of the spaces in the insulating tube 351 are sequentially increased from the side of the wafer region 43 is obtained, and the gas is cooled until arrival at the furnace port part 47 to obtain a very effective temperature distribution.

Furthermore, the insulating plates 352 configured to divide the insulating tube 351 into the plurality of spaces have a gap between the insulating plate 352 and a through-hole or a sidewall of the insulating tube 351, and thus, the regions over and under the insulating plate 352 are spatially connected to each other. Accordingly, even when the spaces in the insulating tube 251 are heated to a high temperature by heat exchange with the gas from the wafer region 43, since a pressurized state of the spaces can be suppressed and the decompressed state can be maintained even after the heat exchange, the spaces can be prevented from becoming a contamination source of the remaining air, and so on.

In addition, in the first heat exchanger 35, as shown in FIGS. 2 and 6, in a state in which the seal cap 102 seals the space in the process chamber 44, at least a portion of the first heat exchanger 35 may be disposed to overlap with the lower end of the induction coil 50 configured to heat the wafer region 43. More specifically, the first heat exchanger 35 is formed of an induction-heated member (for example, carbon), similar to the body to be heated 48, and may have an upper end extending over the lower end of the induction coil 50. According to the configuration, when an epitaxial layer is formed on the SiC wafer 14, influence of heat leakage from the lower side of the boat 30 in the wafer region 43 can be reduced. As a result, temperature uniformity of the SiC wafer 14 placed on the lower portion of the process chamber can be improved, and temperature uniformity in the process chamber can be improved.

When the first heat exchanger 35 includes the induction-heated member (for example, carbon), as shown in FIG. 9, a slit 353 may be formed in a sidewall at a lower side of the insulating tube 351 of the first heat exchanger 35. This is because, when the slit 353 is formed, the outer circumference of the insulating tube 351 is cut into several segments, and revolution of the induction current around the lower side of the insulating tube 351 is suppressed even when the induction coil 50 generates an alternating magnetic field. That is, since the induction heating to the lower side of the insulating tube 351 is suppressed, heat exchange with the gas from the wafer region 43 can be securely and effectively performed.

As described above, the first heat exchanger 35 may be formed of carbon, which is an example of the induction-heated member, and more preferably, a silicon carbide (SiC) film may be coated thereon. As a result, leakage of the gas or generation of particles can be suppressed.

In addition, the material of the first heat exchanger 35 may be appropriately varied according to a processing temperature of the wafer region 43. For example, when the processing temperature is 1400° C. or less, SiC may be considered, and when 1000° C. or less, quartz may be considered.

The first heat exchanger 35 as described above may be configured by vertically stacking the plurality of cylindrical members.

The cylindrical member constituting the first heat exchanger 35 may be exemplified as a configuration shown in FIG. 10. The cylindrical member 35b in the shown example has a cylindrical shape having a side wall 35e and a hollow interior denoted as a space 41 with one end closed by a closed end part 35d and the other end open. The first heat exchanger 35 is configured by disposing the bottomed uncovered cylindrical vessels, in which the closed end part 35d forms a bottom part, in an inverse posture, and stacking the vessels. Accordingly, the closed end part 35d constitutes the insulating plate 352 of the first heat exchanger 35. In addition, as the plurality of cylindrical members 35b are stacked, the closed end part 35d of the cylindrical member 35b corresponding to a lower end of the stacked members covers a lower opening of the cylindrical member 35b thereon. Further, a through-hole 35c is formed at a portion of the closed end part 35d to discharge atmosphere in the space 41 of the cylindrical member 35b to the outside of the space 41. Through the through-hole 35c, regions over and under the closed end part 35d, i.e., the space 41 in the cylindrical member 35b at the lower end and the space 41 in the cylindrical member 35b at the upper end, are spatially connected to each other. Furthermore, the closed end part 35d of the cylindrical member 35b disposed at the uppermost end may have no through-hole 35c to prevent introduction of the gas.

As described above, when the plurality of cylindrical members 35b are vertically stacked to constitute the first heat exchanger 35, the first heat exchanger 35 can be very easily assembled. In addition, since the assembly is easy, the plurality of cylindrical members 35b can be easily stacked to increase a surface area for heat exchange with the gas from the wafer region 43, and the heat exchange can be further effectively promoted. Further, even when the first heat exchanger 35 including the hollow tube divided into the plurality of spaces is formed of a carbon material, the first heat exchanger 35 can be easily manufactured by stacking the plurality of cylindrical members 35b.

When the first heat exchanger 35 is configured by stacking the plurality of cylindrical members 35b, positions of the through-holes 35c of the cylindrical members 35 may be different from each other. That is, the plurality of cylindrical members 35b are vertically stacked to differentiate two-dimensional positions of the through-holes 35c, constituting the first heat exchanger 35. As a result, since the through-holes 35c do not two-dimensionally overlap with each other, influence of the radiation heat from the wafer region 43 to the furnace port part 47 can be very effectively suppressed. Specifically, for example, in a state in which the positions of the through-holes 35c are disposed at 90° intervals or more in a circumferential direction, stacking of the cylindrical members 35b may be considered. Accordingly, influence of the radiation heat from the wafer region 43 to the furnace port part 47 can be securely and effectively suppressed.

The plurality of cylindrical members 35b need not have the same shape but may include different heights. Considering influence of a heat exchange rate and radiation heat to the lower portion caused by the first heat exchanger 35 with respect to the heights (cylinder length) of the cylindrical members 35b, a better result is obtained from a shorter member (shorter in height) in any case. However, when the cylinder length is reduced, an increase in part number may cause an increase in equipment cost, and an increase in thermal capacity may cause a decrease in temperature lowering speed. Therefore, in the cylinder length of the cylindrical members 35b, the following variations may be considered.

i) As shown in FIG. 11, in a first variation, the first heat exchanger 35 is configured by disposing shorter cylindrical members 35b-1 (shorter in cylinder length) at an upper portion of the first heat exchanger 35, i.e., a side of the wafer region 43 in which the boat 30 is disposed, and disposing taller cylindrical members 35b-2 (longer in cylinder length) at the other portion.

ii) As shown in FIG. 12, in a second variation, the first heat exchanger 35 is configured by disposing shorter cylindrical members 35b-1 (shorter in cylinder length) at a lower portion of the first heat exchanger 35, i.e., a side of the furnace port part 47, and disposing taller cylindrical members 35b-2 (longer in cylinder length) at the other portion.

iii) As shown in FIG. 13, in a third variation, the first heat exchanger 35 is configured by disposing shorter cylindrical members 35b-1 (shorter in cylinder length) at upper and lower sides of the first heat exchanger 35, and disposing taller cylindrical members 35b-2 (longer in cylinder length) at the other portion (about a center portion).

In the above variations i) to iii), variation i) in which the cylindrical members 35b-1 having a small cylinder length are disposed at the upper side is preferable to improve a heat exchange rate of the first heat exchanger 35. When the cylindrical members 35b at the upper side have a small cylinder length, radiation heat at the upper side can be actively blocked, a temperature gradient can be formed at the upper side, and thus, improvement in heat exchange rate at the lower side can be expected.

In addition, the first heat exchanger 35 is not configured by stacking the cylindrical member 35b but may be configured, as shown in FIG. 14, by disposing the insulating plate 352 in which a plurality of plate members are stacked in one big hollow cylindrical insulating tube 351. That is, the insulating plates 352 may be supported by columns 354 to be stacked, and a structure thereof may be accommodated in the insulating tube 351. In this case, even when the through-hole 35c is not formed in the insulating plate 352, since there is a gap 355 between the insulating plate 352 and an inner surface of the sidewall of the insulating tube 351, the regions over and under the insulating plate 352 in the insulating tube 351 are spatially connected to each other. However, the through-hole 35c may be formed.

Further, in this case, configuration of the insulating plate 352 can be easily modified by varying disposition of the plurality of plate members. Accordingly, the insulating plate 352 can easily and flexibly correspond to specification change of the first heat exchanger 35.

Furthermore, in this case, since the first heat exchanger 35 is constituted by the cylindrical member and the plurality of plate members, manufacturing cost can be reduced, and periodical maintenance can be easily performed.

Even in this case, the slit 353 may be formed in the sidewall of the lower side of the insulating tube 351, and thus, revolution of the induction current at the lower side of the insulating tube 351 may be suppressed.

(Second Heat Exchanger)

As shown in FIGS. 6 and 8, the second heat exchanger 36 is disposed at an outer circumferential side of the first heat exchanger 35 to be horizontally spaced apart from the first heat exchanger 35 by the gap 33.

Figure 15:
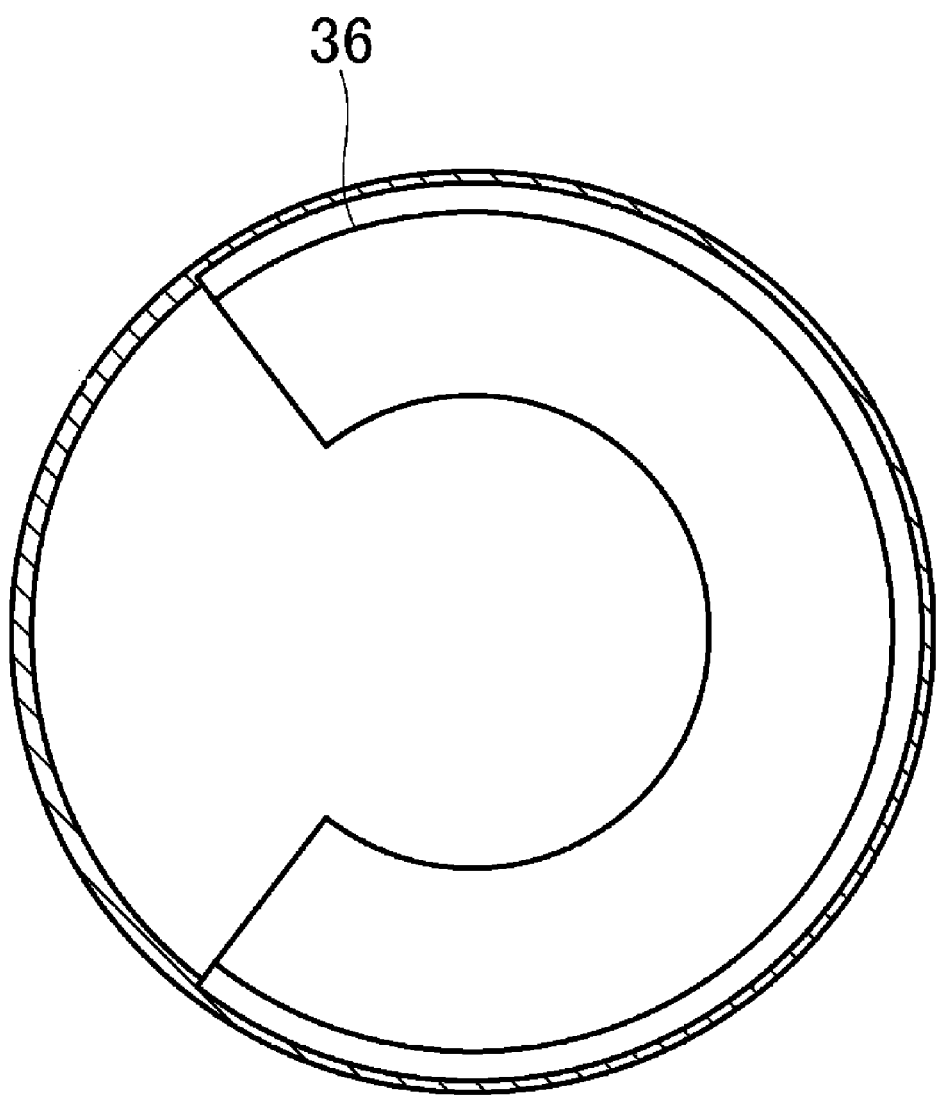
FIG. 15 is a specific plan view of a second heat exchanger of the process furnace used in the substrate processing apparatus according to an embodiment of the present invention.
Figure 16:
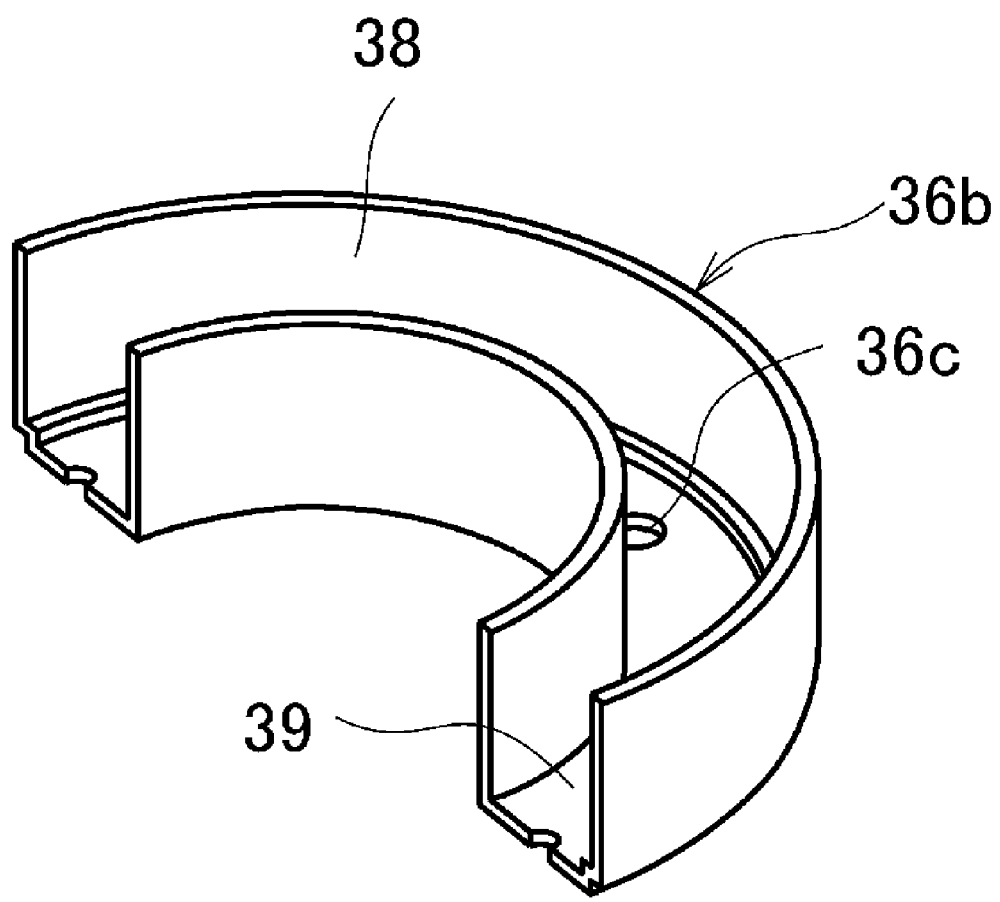
FIG. 16 is a partial perspective view of the second heat exchanger of the process furnace used in the substrate processing apparatus according to an embodiment of the present invention.

FIG. 15 is a specific plan view of the second heat exchanger 36, and FIG. 16 is a partial perspective view of the second heat exchanger 36.

As shown in FIGS. 4 and 15, the second heat exchanger 36 has, for example, an inverse C-shaped hollow cylinder shape, when seen from an upper side, to avoid a position at which the gas supply part 160 is formed. When the second heat exchanger 36 has a hollow cylindrical shape, similar to the first heat exchanger 35, heat exchange can be promoted, and heat deterioration of the member at the lower side of the process chamber can be securely suppressed.

In addition, similar to the first heat exchanger 35, the second heat exchanger 36 may have a configuration in which a plurality of heat exchange bodies are vertically stacked to form a plurality of spaces, which are vertically partitioned. When the plurality of heat exchange bodies are stacked to constitute the second heat exchanger 36, radiation can be blocked and insulating capability of the second heat exchanger 36 can be improved. Further, since the second heat exchanger 36 can be easily assembled and a contact area between the outer wall and the gas can be easily increased, heat exchange can be further promoted and heat deterioration of the member at the lower side of the process chamber can be securely suppressed. Furthermore, the second heat exchanger 36 can be easily manufactured. In particular, when the second heat exchanger 36 is formed of a carbon material, etc., while a complex shape, which is difficult to machine, cannot be easily manufactured, the second heat exchanger 36 can be easily manufactured by employing a stacked structure of the heat exchange bodies.

While the heat exchange body constituting the second heat exchanger 36 may be a duct type having a rectangular cross-section, for example, as shown in FIG. 16, a U-shaped heat exchange body 36b having an open upper part may be formed, and formation of the through-hole 36c in a lower end surface 39 may be considered. By stacking the heat exchange bodies 36b, the lower end surface 39 of the heat exchange body 36b at the upper end covers an upper opening of the heat exchange body 36b thereunder.

When the heat exchange body 36b is configured as such, for example, even if the atmosphere in a space 38 of the heat exchange body is thermally expanded, the atmosphere is discharged from the through-hole 36c, a pressure difference between the inside and the outside of the heat exchange body disappears, and generation of breakage and crack of the heat exchange body 36b can be suppressed. In addition, even when the atmosphere in the space 38 is discharged from the space 38, since the through-hole 36c is formed at the lower end surface 39, mixing of particles and contaminants in the process chamber 44 can be suppressed.

Further, when the heat exchange body 36b disposed at the uppermost end is a duct type having a rectangular cross-section and the upper surface has no through-hole, it is preferable because the gas is not introduced into the heat exchange body 36.

However, in a vertical positional relationship, while the first heat exchanger 35 and the second heat exchanger 36 can have the same height at the upper ends thereof, as shown in FIG. 6, a step 31 may be provided such that the height of the upper end of the first heat exchanger 35 is higher than that of the second heat exchanger 36. When the step 31 is provided, since a gas flow path can be obtained at the upper side of the second heat exchanger 36, the gas can also be supplied to the wafer 14 at the lowermost part of the wafer region 43, similar to the wafer 14 at the upper side. Therefore, thinning of a film thickness of the wafer 14 at the lowermost part can be suppressed, and as a result, heat treatment uniformity between the wafers 14 and in the surface of the wafer 14 placed on the lowermost part of the boat 30 can be improved.

Further, a horizontal thickness t36a of the second heat exchanger 36 may be larger than a horizontal width t33 of the gap 33. According to the configuration, a heat transfer path (gap) in which a heat transfer operation toward the lower side of the process chamber through the furnace port part 47 occurs can be reduced. Accordingly, heat exchange at the lower side of the process chamber can be promoted, and heat deterioration of the member at the lower side of the process chamber can be further suppressed.

That is, it is preferable that the gap 33 between the first heat exchanger 35 and the second heat exchanger 36 is set to a minimum value. This is because heat exchange by the first heat exchanger 35 and the second heat exchanger 36 can be promoted, and intrusion of a process gas into the furnace port part 47 and thus generation of particles can be suppressed.

Calorie exchanged between a gas flowing through a flow path and a peripheral member can be represented by the following formula.

$$Q = A1h(Tg - Tw) \quad (1)$$

(Q: Calorie, A1: Heat exchange area, h: Heat transfer rate, Tg: Gas temperature, Tw: Wall temperature)

In addition, variation in temperature of the gas corresponding to the exchanged calorie can be represented by the following formula.

$$Tg(n+1) = Tg(n) - Q/A2u\rho Cp \quad (2)$$

(A2: Flow path area, u: Flow velocity, ρ: Density, Cp: Specific heat)

From formula (1), in order to increase the exchanged calorie, a heat exchange area (A1, a contact area between the gas and the member) should be increased. Further, in order to further decrease the temperature of the gas using the exchanged calorie, it is obvious that a small flow path area (A2, a cross-sectional area of a flow path through which a gas passes) is good.

In order to increase the heat exchange area, the cylinder length of the first heat exchanger 35 or the second heat exchanger 36 may be increased, or the second heat exchanger 36 may be disposed at a horizontal periphery of the first heat exchanger 35, and heat exchange may be performed at both sidewalls thereof. Furthermore, in order to reduce the flow path area, the gap 33 between the first heat exchanger 35 and the second heat exchanger 36 may be reduced as much as possible.

When the heat exchanger has a non-cylindrical shape and disc-shaped insulating plates are stacked in parallel in a vertical direction to form a stack structure, since heat radiation is reflected by the plurality of insulating plates, radiation can be effectively blocked. However, since the entire circumference of the disc is not the heat exchange area, the heat exchange area of the disc is slightly reduced in comparison with the cylindrical shape. In this regard, when an amount of the carrier gas is increased, the cylindrical heat exchanger is advantageous as the heat exchange area is increased. In this embodiment, since promotion of blocking of radiation as well as heat exchange between the gas and the member is needed, a radiation blocking effect must be somewhat secured even in the cylindrical shape. Accordingly, for example, in the first heat exchanger 35, the inside of the hollow cylindrical insulating tube 351 is divided into the plurality of spaces by the insulating plate 352.

In addition, the gas exhaust port 90a may be installed at a side lower than the first heat exchanger 35 and the second heat exchanger 36 to exhaust the gas in the process chamber 44. Accordingly, since the gas from the wafer region 43 is exhausted from the gas exhaust port 90a through the gap 33 between the first heat exchanger 35 and the second heat exchanger 36, heat exchange between the first and second heat exchangers 35 and 36 and the gas can be further securely promoted.

(Third Heat Exchanger)

Figure 17:
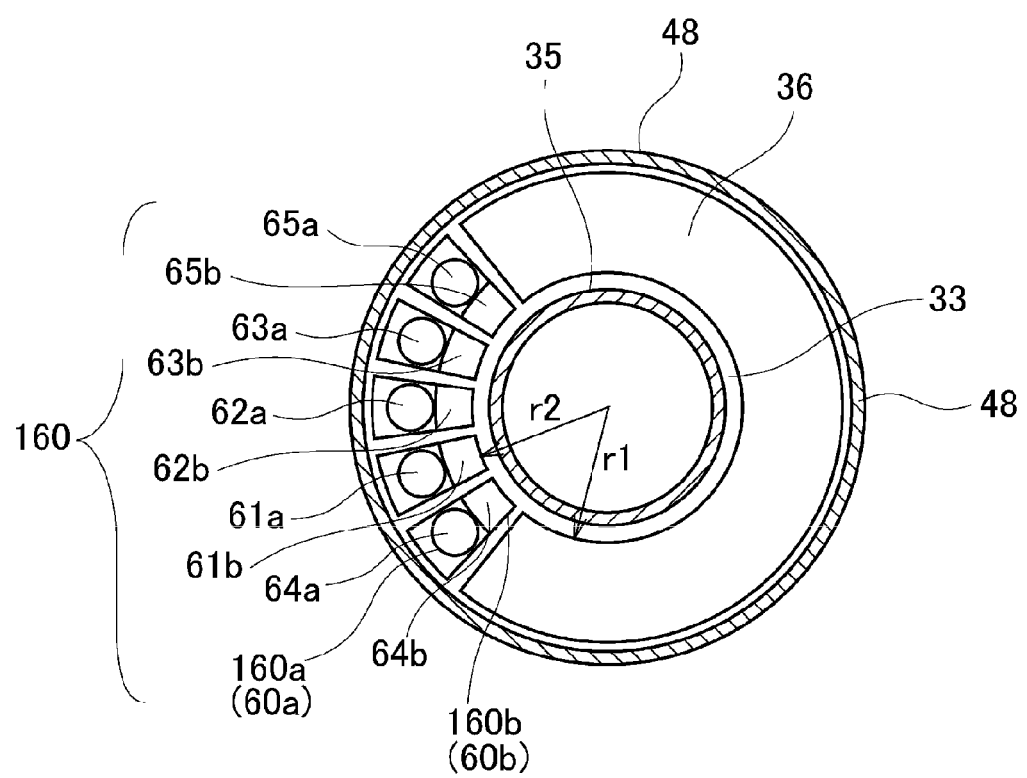
FIG. 17 is a plan cross-sectional view showing a lower surface of the process furnace used in the substrate processing apparatus according to an embodiment of the present invention.

FIG. 17 is a plan cross-sectional view showing a lower structure of the process furnace 40.

As shown, the gas supply part 160 is installed in the process chamber 44. The gas supply part 160 horizontally supplies a gas to the wafer 14 held on the boat 30 in the process chamber 44. The gas supply part 160 includes one portion, which becomes a lower side, and the other portion, which becomes an upper side. The portion that becomes the lower side of the gas supply part 160 is disposed around a horizontal side of the first heat exchanger 35. The other portion, which becomes the upper side of the gas supply part 160, is disposed around a horizontal side of the boat 30.

In addition, the gas supply part 160 includes a gas flow path 160a through which a gas flows, and a flow path insulating tube 160b configured to perform heat exchange with the gas in the process chamber 44.

The gas flow path 160a is disposed to extend from the portion that becomes the lower side of the gas supply part 160 toward the other portion, which becomes the upper side. Further, the gas is supplied from the gas flow path 160a constituting the other portion that becomes the upper side of the gas supply part 160 to the wafer 14 held on the boat 30 in the process chamber in a direction parallel to the wafer 14. That is, the gas flow path 160a constitutes the portion that becomes the lower side of the gas supply part 160 and is disposed to be spaced apart from the first heat exchanger 35 in a horizontal direction.

The flow path insulating tube 160b is disposed at a lower side of the gas supply part 160 to be spaced apart from the first heat exchanger 35 by the gap 33 in a horizontal direction of the first heat exchanger 35. That is, the flow path insulating tube 160b constitutes the portion that becomes the lower side of the gas supply part 160, similar to the gas flow path 160a, and is installed at a side of the first heat exchanger 35 nearer than the gas flow path 160a. The flow path insulating tube 160b has a cylindrical shape and functions as a third heat exchanger configured to perform heat exchange with the gas flowing through the gap 33, similar to the first heat exchanger 35 and the second heat exchanger 36.

As described above, in addition to the second heat exchanger 36, since the flow path insulating tube 160b is further installed at the gas flow path formed between the body to be heated 48 and the first heat exchanger 35, heat exchange at the lower side of the gas supply part 160 can be promoted, and thus, heat deterioration of the member at the lower side of the process chamber can be suppressed. Further, a horizontal width of the process chamber 44 can be substantially increased, compared to the wafer 14, and a flow space of the gas from the gas supply part 160 in a horizontal direction can be increased. For this reason, a gas mixing space may be formed in the middle of the gas flow or preliminary heating of the gas can be performed to improve heat treatment uniformity between the wafers and in the surface of the wafer.

In particular, when the flow path insulating tube 160b, which is the third heat exchanger, is installed at a side of the first heat exchanger 35 rather than the gas flow path 160a, the entire peripheral area of the first heat exchanger 35 in a horizontal direction is covered by the second heat exchanger 36 and the flow path insulating tube 160b. As a result, heat exchange at the entire lower side of the process chamber can be promoted, and heat deterioration of the member at the lower side of the process chamber can be further suppressed.

Here, the gas flow path 160a may be constituted by a gas supply nozzle 60a, and the gas supply nozzle 60a may extend from the portion that becomes the lower side of the gas supply part 160, and the other portion that becomes the upper side thereof. In this case, a plurality of gas supply holes may be formed at a portion, which becomes an upstream side of the gas supply nozzle 60a, and the gas may be supplied from the gas supply holes to the wafer 14 held on the boat 30 in the process chamber 44 in the horizontal direction.

In addition, the gas flow path 160a may be constituted by the gas supply nozzle 60a using a portion that becomes a downstream side of the gas supply part 160, and the gas flow path 160a constituting the other portion, which becomes an upstream side of the gas supply part 160 may be constituted as a simple space in communication with the gas supply nozzle 60a. In this case, the gas may be supplied to the wafer 14 held on the boat 30 in the process chamber 44 through the space in the horizontal direction. In this case, the flow path insulating tube 160b may be constituted by a nozzle insulating tube 60b installed at a side of the first heat exchanger 35 rather than the gas supply nozzle 60a.

Further, as shown in FIG. 17, an inner circumferential radius r1 of the second heat exchanger 36 in the horizontal direction is equal to an inner circumferential radius r2 of the nozzle insulating tube adjacent to the first heat exchanger 35 in the horizontal direction. When the inner circumferential radii are equal to each other, the heat transfer path (gap), which causes a heat transfer operation toward the lower side of the process chamber, can be reduced over the entire lower side of the process chamber, heat exchange over the entire lower side of the process chamber can be promoted, and heat deterioration of the member at the lower side of the process chamber can be further suppressed.

(Lower Insulating Part)

Figure 18:
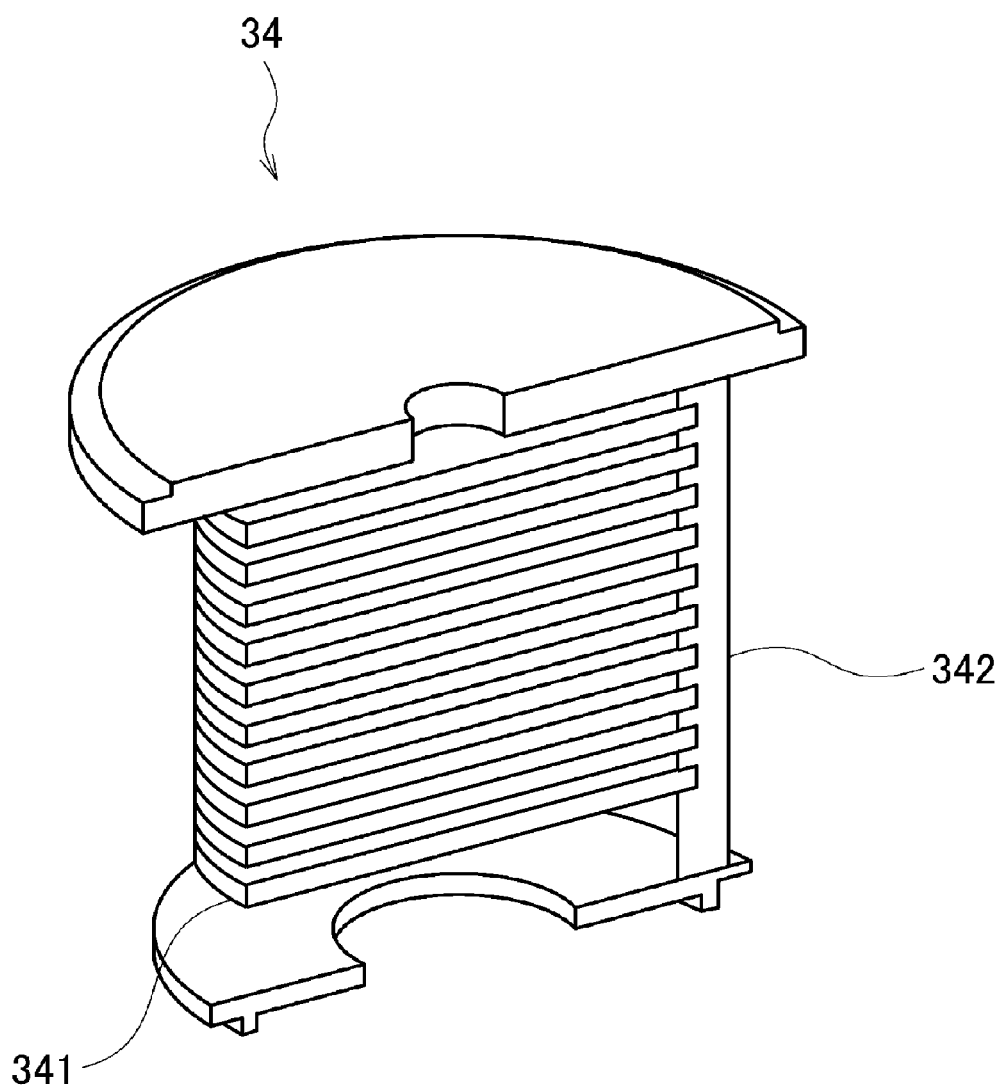
FIG. 18 is a perspective cross-sectional view showing a specific example of a lower insulating part used in the substrate processing apparatus according to an embodiment of the present invention.

FIG. 18 is a perspective cross-sectional view showing a specific example of the lower insulating part 34.

The lower insulating part 34 is configured such that the plurality of plate members 341 are supported by a column member 342, and thus, the plate members 341 are vertically stacked. In the plate members 341 and the column member 342, at least the plate members 341 may be formed of an opaque material, through which light cannot easily pass, to prevent an increase in temperature due to radiation. In addition, preferably, the lower insulating part 34 may be made of a material having a higher insulating performance (lower thermal conductivity) than the first heat exchanger 35. The material may be, for example, quartz, in this case, preferably, opaque quartz to block heat radiation.

In the lower insulating part 34 as configured above, the plate members 341 vertically stacked in a multi-stage effectively block heat radiation from the wafer region 43. Even when the first heat exchanger 35 is heated to a high temperature by heat exchange with the gas from the wafer region 43, the heat is insulated by the lower insulating part 34. Accordingly, the lower insulating part 34 can securely and effectively prevent the heat from the wafer region 43 from being transferred to the furnace port part 47 disposed at the lower side thereof, in particular, the bearing part of the rotary shaft 106 using a magnetic fluid. That is, the bearing part of the rotary shaft 106 can be securely and effectively protected from the heat.

Further, the lower insulating part 34 is provided for the main purpose of protecting the rotary shaft from heat, unlike the first heat exchanger 35 provided for the main purpose of lowering the temperature of a gas. Accordingly, due to the necessity to block influence of radiation from directly above and heat transfer in a direction of the rotary shaft caused by heat exchange, the lower insulating part 34 is not provided in a hollow cylindrical shape like the first heat exchanger 35 but may have a structure in which the plurality of plate members 341 are stacked.

The plurality of plate members 341 constituting the lower insulating part 34 have a diameter smaller than that of the first heat exchanger 35 to install the insulating ring 37 around the lower insulating part 34.

(Insulating Ring)

As shown in FIGS. 6 and 8, the insulating ring 37 projects from an upper surface of the seal cap 102 toward the first heat exchanger 35 to surround a side portion of the lower insulating part 34. Similarly, the insulating ring 37 may be formed of an opaque member, through which light cannot easily pass, to prevent an increase in temperature due to radiation. More preferably, the insulating ring 37 is made of a material having a higher insulating performance (lower thermal conductivity) than the first heat exchanger 35. The material may be, for example, quartz, in this case, opaque quartz to block heat radiation. Since the insulating ring 37 has functions of isolating a high temperature carrier gas and simultaneously blocking radiation from above, radiation can be effectively blocked according to the opaque level of the insulating ring 37.

In addition, the insulating ring 37 is configured such that a horizontal diameter is equal to or less than the horizontal diameter of the first heat exchanger 35. Accordingly, the insulating ring 37 can securely suppress introduction of the process gas flowed along the outer sidewall of the first heat exchanger 35 into the inner circumferential side of the insulating ring 37, i.e., a side at which the rotary shaft 106 is disposed.

In order to protect the rotary shaft 106 from the heat, disposition of the insulating ring 37 far from the rotary shaft 106 is more effective. However, when the diameter of the insulating ring 37 is larger than the diameter of the first heat exchanger 35, since the process gas introduced along the outer sidewall of the first heat exchanger 35 enters the inner circumferential side of the insulating ring 37, the rotary shaft 106 cannot be protected from the heat. Accordingly, in order to block introduction of the process gas into the inner circumferential side and dispose the insulating ring 37 at a position farthest from the rotary shaft 106, the insulating ring 37 may have the same diameter as the first heat exchanger 35.

Further, when the diameter of the insulating ring 37 is equal to the diameter of the first heat exchanger 35, at an interface between the lower end of the first heat exchanger 35 and the upper end of the insulating ring 37, a flow of the high temperature carrier gas flowing down from the above becomes smooth, not being scattered. That is, as the smooth gas flow is realized, probability of introduction of the gas into the inner circumferential side of the insulating ring 37 can be maximally suppressed. Even in this regard, the insulating ring 37 may have the same diameter as the first heat exchanger 35.

In the inner circumferential side of the insulating ring 37, a purge gas may be flowed to the rotary shaft 106. When the purge gas is flowed to the rotary shaft 106, a purge effect is increased, and when a certain flow rate of purge gas is flowed, the rotary shaft 106 may be cooled. In addition, as the insulating ring 37 suppresses introduction of the carrier gas, attachment of byproducts around the rotary shaft 106 can also be suppressed.

Figure 19:
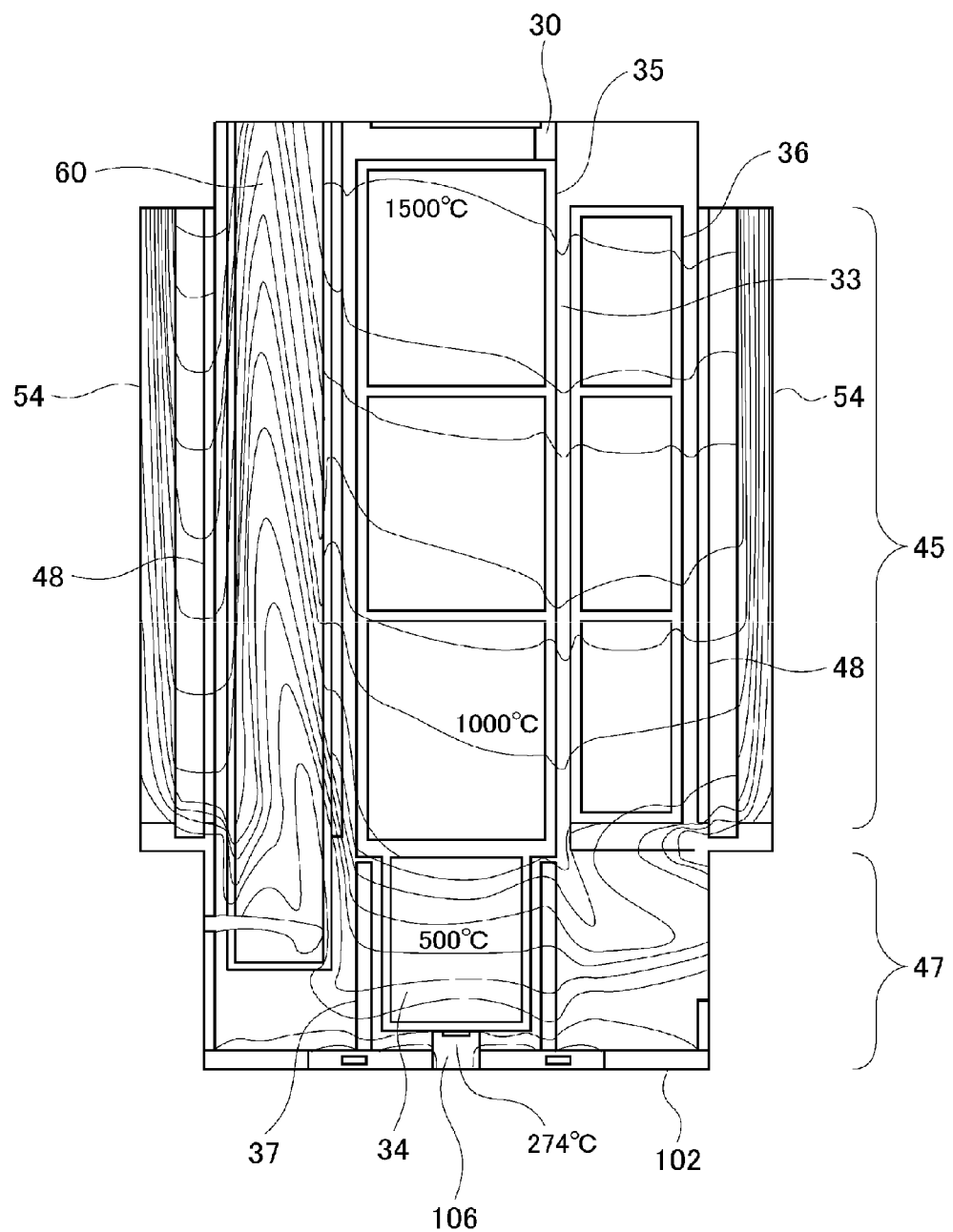
FIG. 19 is a vertical cross-sectional view of the lower structure of the process furnace used in the substrate processing apparatus according to an embodiment of the present invention, explaining an example of a calculation result of temperature distribution in a furnace when an insulating ring is installed.
Figure 20:
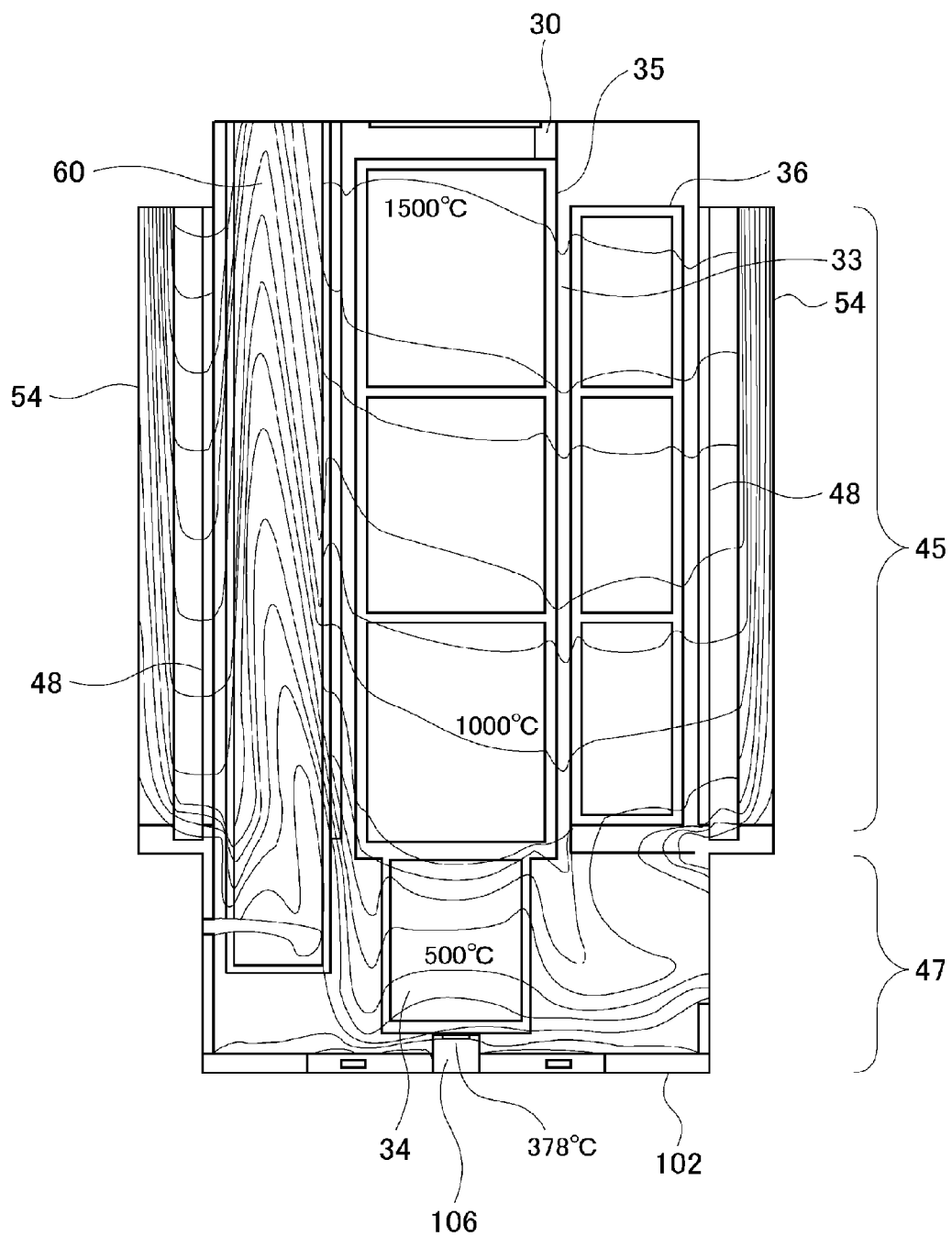
FIG. 20 is a view for explaining an example of a calculation result of temperature distribution in a furnace when no insulating ring is installed, as a comparative example to FIG. 19.

FIG. 19 is a view for explaining an example of a calculated result of temperature distribution in the furnace when the insulating ring 37 is installed. FIG. 20, which is a comparative example of FIG. 19, is a view for explaining one example of a calculated result of the temperature distribution in the furnace when there is no insulating ring 37.

As will be apparent from FIGS. 19 and 20, when there is no insulating ring 37, a temperature around the rotary shaft 106 is increased (for example, 378° C.); whereas, as the insulating ring 37 is installed, the temperature around the rotary shaft 106 can be lowered (for example, 274° C.).

Further, in the calculated result shown in FIG. 19, the calculation is performed assuming that the insulating ring 37 is formed of opaque quartz, but when the insulating ring 37 is formed of transparent quartz, a temperature lowering effect is weakened. Accordingly, it will be appreciated that the insulating ring 37 functions to isolate the high temperature carrier gas and simultaneously block radiation from above. That is, even when a flow rate of the carrier gas is not high, if the processing temperature is high, the insulating ring 37 can block the radiation from above to lower the temperature around the rotary shaft 106.

As described above, when the insulating ring 37 formed of a ring-shaped insulating member is installed on the seal cap 102 to surround the rotary shaft 106 of the boat 30, it is very effective to maintain the magnetic fluid used as a sealing member at the bearing part of the rotary shaft 106 to a heat-resistant temperature or less. In addition, since introduction of the gas around the rotary shaft 106 may be blocked by installation of the insulating ring 37, a suppression effect of attachment of byproducts can be expected.

(5) Effect According to the Embodiment

According to the embodiment, one or more of the following effects can be provided.

(i) According to the embodiment, since the first heat exchanger 35 performs heat exchange with the gas flowing from the wafer region 43 to the furnace port part 47, the high temperature gas is cooled until arrival at the furnace port part 47. Further, since the insulating plate 352 is installed in the insulating tube 351 of the first heat exchanger 35, heat transfer by radiation from the wafer region 43 is suppressed. Accordingly, heat deterioration of the member constituting the furnace port part 47 disposed at the lower side of the process chamber 44 can be suppressed, and stable substrate processing can be realized. Furthermore, since the regions over and under the insulating plate 352 are spatially connected to each other, a pressurized state of the region in the tube of the first heat exchanger 35 after heat exchange can be suppressed to maintain the decompressed state, and thus, the region can be prevented from becoming a contamination source of the remaining air.

(ii) According to the embodiment, the second heat exchanger 36 is installed to be spaced apart from the first heat exchanger 35 by a gap in a horizontal direction of the first heat exchanger 35. For this reason, the gas from the wafer region 43 flows to the furnace port part 47 through the gap between the first heat exchanger 35 and the second heat exchanger 36 to be exhausted from the furnace port part 47. At this time, the second heat exchanger 36 is installed to narrow the gas flow path in comparison with the case in which the second heat exchanger 36 is not provided. Accordingly, efficiency of the heat exchange of the first heat exchanger 35 can be improved, and heat deterioration of the member constituting the furnace port part 47 can be suppressed.

(iii) According to the embodiment, since the plurality of cylindrical members 35b are vertically stacked to constitute the first heat exchanger 35, the first heat exchanger 35 can be very easily assembled. In addition, since the first heat exchanger can be easily assembled, an increase in surface area for heat exchange with the gas from the wafer region 43 can be easily realized by stacking the plurality of cylindrical members 35b, and the heat exchange can be more effectively promoted. Further, even when the first heat exchanger 35 divided into a plurality of spaces in the hollow tube is formed of a carbon material, the first heat exchanger 35 can be easily manufactured by stacking the plurality of cylindrical members 35b.

(iv) According to the embodiment, when the plurality of cylindrical members 35b are vertically stacked to constitute the first heat exchanger 35, positions of the through-holes 35c of the cylindrical members 35b are different from each other such that the through-holes 35c do not overlap with each other. Accordingly, influence of the radiation heat from the wafer region 43 to the furnace port part 47 can be securely and effectively suppressed.

(v) According to the embodiment, in the plurality of cylindrical members 35b constituting the first heat exchanger 35 having different heights, as the shorter cylindrical members 35b-1 are disposed at the upper side (a side of the boat 30), radiation heat at the upper side can be actively blocked, and a temperature gradient can be formed at the upper side. Accordingly, improvement in heat exchange rate at the lower portion of the first heat exchanger 35 can be expected.

(vi) According to the embodiment, the lower insulating part 34 made of a material having a thermal conductivity lower than that of the first heat exchanger 35 is installed under the first heat exchanger 35. Accordingly, even when the first heat exchanger 35 is heated to a high temperature by heat exchange with the gas from the wafer region 43, heat of the first heat exchanger 35 is insulated by the lower insulating part 34, and heat transfer to the member constituting the furnace port part 47 disposed at the lower side of the process chamber can be suppressed.

(vii) According to the embodiment, the lower insulating part 34 includes the plurality of plate members 341, which are vertically stacked, and the column member 342 configured to support the plurality of plate members 341. Accordingly, the lower insulating part 34 can reflect heat radiation using the plurality of plate members 341 in a multi-stage manner, maintain heat energy in the process chamber 44, and effectively protect the furnace port part 47 (in particular, the rotary shaft 106 using the magnetic fluid) having low heat-resistant performance from the radiation.

(viii) According to the embodiment, the insulating ring 37 made of a material having a thermal conductivity lower than that of the first heat exchanger 35 is installed to surround a side portion of the lower insulating part 34. Accordingly, since introduction of the gas lowered along the first heat exchanger 35 into the inside of the insulating ring 37 can be suppressed, heat deterioration of the member constituting the furnace port part 47 (in particular, the bearing part of the rotary shaft 106) can be suppressed. That is, when the rotary shaft 106 of the furnace port part 47 is in an exposed state, while the temperature may be increased due to exposure to the high temperature carrier gas as well as the heat from the above by the radiation, the magnetic fluid used as the sealing material of the rotary shaft 106 can be maintained at a heat-resistant temperature or less (for example, about 100° C.) by installing the insulating ring 37.

(ix) According to the embodiment, the slit 353 is installed at the lower sidewall of the insulating tube 351 of the first heat exchanger 35 to cut the outer circumference of the insulating tube 351 into several segments. Accordingly, even when the induction coil 50 generates an alternating magnetic field, since revolution of the induction current at the lower side of the insulating tube 351 is suppressed and thus induction heating of the lower portion of the insulating tube 351 is also suppressed, the first heat exchanger 35 can securely and effectively perform heat exchange with the gas from the wafer region 43.

(x) According to the embodiment, in a state in which the seal cap 102 closes the space in the process chamber 44, at least a portion of the first heat exchanger 35 is disposed to overlap with the lower end of the induction coil 50 heating the wafer region 43. Accordingly, when the epitaxial layer is formed on the SiC wafer 14, influence of discharge of the heat from the lower side of the boat 30 of the wafer region 43 can be reduced. As a result, temperature uniformity of the SiC wafer 14 placed on the lower portion of the process chamber can be improved, and temperature uniformity in the process chamber 44 can be improved.

(xi) According to the embodiment, the horizontal diameter of the insulating ring 37 is equal to or less than the horizontal diameter of the first heat exchanger 35. Accordingly, the insulating ring 37 can securely suppress introduction of the process gas introduced along the outer sidewall of the first heat exchanger 35 into the inner circumferential side of the insulating ring 37, i.e., a side at which the rotary shaft 106 is disposed.

(xii) According to the embodiment, the diameter of the insulating ring 37 is equal to the diameter of the first heat exchanger 35. Accordingly, introduction of the process gas into the inner circumference can be blocked to realize a smooth gas flow, and the insulating ring 37 can be disposed at a position farthest from the rotary shaft 106, effectively protecting the rotary shaft 106 from the heat.

Another Embodiment of the Invention

Hereinafter, another embodiment of the present invention will be described.

Another Embodiment

In the above-described embodiment, while the first heat exchanger 35 and the second heat exchanger 36 are exemplarily installed as the heat exchange system, the second heat exchanger 36 may not be installed in another embodiment described below.

Figure 21:
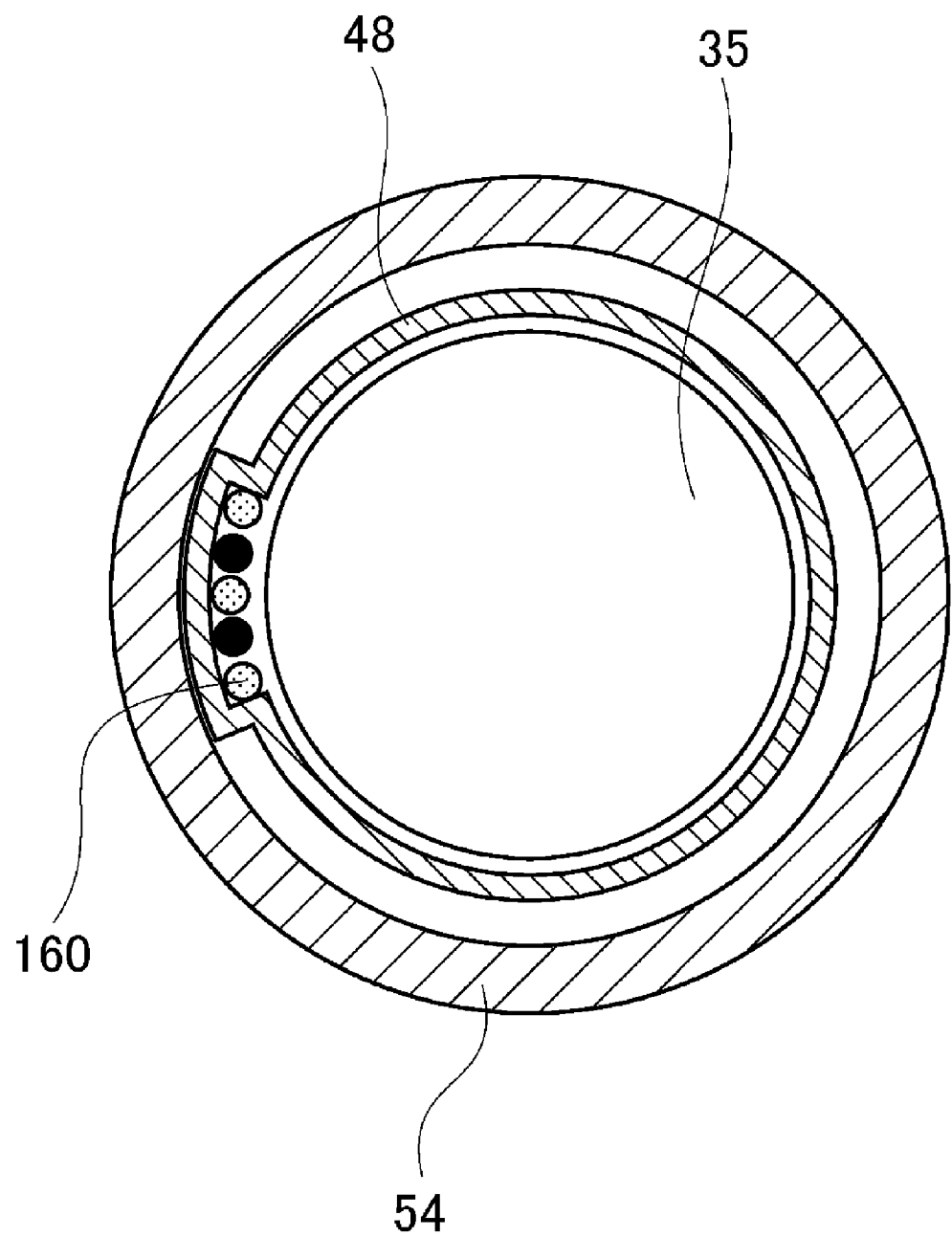
FIG. 21 is a plan cross-sectional view showing a lower structure of a process furnace used in a substrate processing apparatus according to another embodiment of the present invention.

FIG. 21 is a plan cross-sectional view showing a lower structure of a process furnace according to another embodiment.

As shown, when the second heat exchanger 36 is not installed, the body to be heated 48 does not have a simple cylindrical shape, but the gas supply part 160 has an enlarged outer circumferential shape, and the enlarged portion may be used as a nozzle installation space of the gas supply part 160. As described above, when the second heat exchanger 36 is not installed and the body to be heated 48 is partially enlarged to obtain the nozzle installation space of the gas supply part 160, the number of the parts can be reduced while complicating configuration of the body to be heated 48. In addition, as the second heat exchanger 36 is not installed, the diameter of the first heat exchanger 35 can be increased, and thus, a heat exchange area (an outer surface area of the tube in contact with the gas) of the first heat exchanger 35 can be increased.

(Others)

In addition, it will be apparent that the present invention is not limited to the other embodiment but may be variously modified and implemented without departing from the scope of the present invention.

For example, in replacement of the induction heating body constituted by the induction coil and a body to be induced, a substrate heating part constituted by a resistance heating body may be provided. A resistance heater may be used as the resistance heating body. In addition, even in the process furnace including the substrate heating part and configured to heat the wafer through resistance heating from the outside of the reaction tube, the first heat exchanger and the second heat exchanger may be applied to block the radiation and promote heat exchange between the gas and the member. According to the configuration, since there is no need to provide the induction heating member requiring a large number of parts and installation of the resistance heater is basically sufficient, configuration of the process furnace can be simplified. Further, since the wafer is heated from the outside of the reaction tube, when the wafer is heat-treated at a high temperature of, for example, 1500° C. or more, the reaction tube may be formed of a member that can endure a high temperature of 1500° C. or more, for example, a carbon material.

Further, in replacement of the gas supply nozzle extending to the side of the wafer in the process chamber, the gas supply nozzle may be stayed at the upper end of the nozzle insulating part to supply the gas from a lower side thereof. In this configuration, when the gas is uniformly supplied to the plurality of stacked wafers, while control of the gas flow between the wafers become difficult, a risk of blocking the gas supply nozzle can be reduced, in comparison with the case that the gas is supplied through the gas supply nozzle extending to the side of the wafer in the process chamber.

Furthermore, for example, in the first heat exchanger 35 and the second heat exchanger 36, in order to fill the space in the hollow tube, the space may be filled with an insulating material such as an insulating felt. In this case, in comparison with the hollow tube, an insulating effect can be increased.

In addition, for example, a restriction part may be installed in the process chamber to restrict the gas flow between the wafers. The restriction part is constituted by a pair of thin plate members formed of a heat-resistant material such as quartz, which are installed at both sides toward the boat. The pair of restriction parts installed to surround the boat control horizontal and vertical flows of the gas flowed from the gas supply nozzle. Accordingly, in comparison with the case of no restriction part, the gas is efficiently supplied onto the wafer surface by horizontal control of the restriction part and the gas is uniformly supplied between the wafer surfaces by vertical control thereof, improving uniformity of the epitaxial layer between the wafer surfaces.

While the above embodiment exemplifies the substrate processing apparatus forming the SiC epitaxial layer on the SiC wafer, the present invention is not limited thereto but may be applied to another substrate processing apparatus as long as it is a vertical substrate processing apparatus. Specifically, the present invention is not limited to a SiC epitaxial growth apparatus but may be applied to an annealing apparatus, and so on. For example, in the case of a SiC annealing apparatus, while a gas flow rate is less than the epitaxial growth, a gas temperature is 1600° C. to 2200° C., which is higher than the epitaxial growth.

Preferred Aspects of the Invention

Hereinafter, preferred aspects according to the embodiment will be additionally stated.

[Supplementary Note 1]
A substrate processing apparatus including:
a process chamber configured to process a plurality of substrates vertically stacked at predetermined intervals;
a substrate retainer configured to hold the plurality of substrates in the process chamber; and
a first heat exchanger installed in the process chamber to support the substrate retainer from a lower portion of the substrate retainer, and configured to perform a heat exchange with a gas flowing in a downward direction from a side of the substrate retainer in the process chamber,
wherein the first heat exchanger includes a hollow cylindrical insulating tube vertically extending in the downward direction and an insulating plate installed in the insulating tube, and
regions in the insulating tube over and under the insulating plate are spatially connected to each other.

[Supplementary Note 2]
The substrate processing apparatus according to additional statement 1, further comprising a second heat exchanger installed in a horizontal direction from the first heat exchanger, second heat exchanger being spaced apart from the first heat exchanger by a gap, and configured to perform a heat exchange with the gas flowing through the gap in the downward direction from the side of the substrate retainer.

[Supplementary Note 3]
The substrate processing apparatus according to additional statement 1 or 2, wherein the first heat exchanger includes a stacked structure of cylindrical members, each of the cylindrical members having a first end closed by a closed end part and a second end open,
the closed end part corresponds to the insulating plate, and
regions over and under the closed end part are spatially connected to each other by a through-hole disposed at the closed end part.

[Supplementary Note 4]
The substrate processing apparatus according to additional statement 3, wherein the through-holes of the cylindrical members are disposed at different two-dimensional positions.

[Supplementary Note 5]
The substrate processing apparatus according to additional statement 3 or 4, wherein the stacked structure includes cylindrical members having different heights, and
a shorter cylindrical member of the cylindrical members is disposed at an upper portion of the stacked structure, and a taller cylindrical member of the cylindrical members is disposed at a lower portion of the stacked structure.

[Supplementary Note 6]
The substrate processing apparatus according to any one of additional statements 1 to 5, further including a lower insulating part installed under the first heat exchanger and made of a material having a thermal conductivity lower than that of the first heat exchanger.

[Supplementary Note 7]
The substrate processing apparatus according to additional statement 6, wherein the lower insulating part includes a plurality of plate members stacked vertically and a column member configured to support the plurality of plate members.

[Supplementary Note 8]
The substrate processing apparatus according to additional statement 6 or 7, further including an insulating ring installed to surround a side portion of the lower insulating part and made of a material having a thermal conductivity lower than that of the first heat exchanger.

[Supplementary Note 9]
The substrate processing apparatus according to any one of additional statements 1 to 8, further including a slit disposed in a sidewall of a lower portion of the first heat exchanger.

[Supplementary Note 10]
The substrate processing apparatus according to claim any one of additional statements 1 to 9, further including an induction heating part installed outside the process chamber and disposed to correspond to at least a periphery of a region where the plurality of substrates are stacked,
wherein at least a portion of the first heat exchanger is disposed to overlap with a lower end of the induction heating part.

[Supplementary Note 11]
A substrate processing apparatus including:
a process chamber configured to process a plurality of substrates vertically stacked at predetermined intervals;
a substrate retainer configured to hold the plurality of substrates in the process chamber;
a first heat exchanger installed in the process chamber to support the substrate retainer from a lower portion of the substrate retainer, and configured to perform a heat exchange with a gas flowing in a downward direction from a side of the substrate retainer in the process chamber; and
a lower insulating part installed under the first heat exchanger,
wherein the lower insulating part is made of a material having a thermal conductivity lower than that of the first heat exchanger, and includes a plurality of plate members stacked vertically and a column member configured to support the plurality of plate members.

[Supplementary Note 12]
The substrate processing apparatus according to additional statement 11, further including an insulating ring installed to surround a side portion of the lower insulating part and made of a material having a thermal conductivity lower than that of the first heat exchanger.

[Supplementary Note 13]
A substrate processing apparatus including:
a process chamber configured to process a plurality of substrates vertically stacked at predetermined intervals;
a substrate retainer configured to hold the plurality of substrates in the process chamber;
a first heat exchanger installed in the process chamber to support the substrate retainer from a lower portion of the substrate retainer, and configured to perform a heat exchange with a gas flowing in a downward direction from a side of the substrate retainer in the process chamber;
a lower insulating part installed under the first heat exchanger and made of a material having a thermal conductivity lower than that of the first heat exchanger; and
an insulating ring installed to surround a side portion of the lower insulating part and made of a material having a thermal conductivity lower than that of the first heat exchanger,
wherein a horizontal diameter of the insulating ring is equal to or less than a horizontal diameter of the first heat exchanger.

[Supplementary Note 14]
The substrate processing apparatus according to additional statement 13, wherein a diameter of the insulating ring is equal to a diameter of the first heat exchanger.

[Supplementary Note 15]
A method of manufacturing a semiconductor device including:
a loading step of loading a plurality of substrates stacked in a vertical direction at predetermined intervals into a process chamber; and a processing step of processing the plurality of substrates in the process chamber by induction-heating an inside of the process chamber using an induction heating part installed around the process chamber and supplying at least a gas into the process chamber, wherein, in the loading step, in a state in which the plurality of substrates are held by a substrate retainer and the substrate retainer is supported by a first heat exchanger including a hollow cylindrical insulating tube extending in a vertical direction and an insulating plate installed in the insulating tube and in which regions over and under the insulating plate in the insulating tube are spatially connected to each other, from a lower portion of the substrate retainer, the substrate retainer and the first heat exchanger are loaded into the process chamber, and in the processing step, the first heat exchanger performs heat exchange with a gas flowing in a downward direction from a side of the substrate retainer along the insulating tube of the first heat exchanger in the process chamber.

What is claimed is:

1. A substrate processing apparatus comprising:
a process chamber configured to process a plurality of substrates vertically stacked at predetermined intervals;
a substrate retainer configured to hold the plurality of substrates in the process chamber; and
a first heat exchanger installed in the process chamber to support the substrate retainer from thereunder, and configured to perform a heat exchange with a gas flowing in a downward direction from a side of the substrate retainer in the process chamber,
wherein the first heat exchanger includes cylindrical members stacked in a vertical direction, each of the cylindrical members having a side wall and a hollow interior with a closed top end and an open bottom end, the cylindrical members being spatially connected to one another via through-holes disposed at the closed top end.

2. The substrate processing apparatus according to claim 1, further comprising a second heat exchanger surrounding a portion of the first heat exchanger with a gap therebetween, wherein the second heat exchanger is configured to perform a heat exchange with the gas flowing through the gap in the downward direction.

3. The substrate processing apparatus according to claim 1, wherein the through-holes are disposed at different two-dimensional positions.

4. The substrate processing apparatus according to claim 1, wherein a height of a cylindrical member at an upper portion of the stacked structure is less than that of a cylindrical member at a lower portion of the stacked structure.

5. The substrate processing apparatus according to claim 1, further comprising a lower insulating part installed under the first heat exchanger and made of a material having a thermal conductivity lower than that of the first heat exchanger.

6. The substrate processing apparatus according to claim 5, wherein the lower insulating plate includes a plurality of plate members stacked in the vertical direction and a column member configured to support the plurality of plate members.

7. The substrate processing apparatus according to claim 5, further comprising an insulating ring installed to surround the lower insulating part and made of a material having the thermal conductivity lower than that of the first heat exchanger.

8. The substrate processing apparatus according to claim 1, further comprising a slit disposed in a sidewall of a lower portion of the first heat exchanger.

9. The substrate processing apparatus according to claim 1, further comprising an induction heating part installed outside the process chamber and disposed to correspond to at least a periphery of a region where the plurality of substrates are stacked,
wherein at least a portion of the first heat exchanger is disposed to overlap with a lower end of the induction heating part.

10. The substrate processing apparatus according to claim 1, wherein the first heat exchanger further comprises an insulating plate disposed at an open bottom end of a lowermost cylindrical member of the stacked structure.

11. The substrate processing apparatus according to claim 1, wherein a closed top end of an uppermost cylindrical member of the stacked structure is without a through-hole.

12. A substrate processing apparatus comprising:
a process chamber configured to process a plurality of substrates vertically stacked at predetermined intervals;
a substrate retainer configured to hold the plurality of substrates in the process chamber;
a first heat exchanger installed in the process chamber to support the substrate retainer from a lower portion of the substrate retainer, and configured to perform a heat exchange with a gas flowing in a downward direction from a side of the substrate retainer in the process chamber; and
a lower insulating part installed under the first heat exchanger and made of a material having a thermal conductivity lower than that of the first heat exchanger,
wherein the first heat exchanger includes a hollow cylindrical insulating tube vertically extending in the downward direction and an insulating plate installed in the insulating tube, and
regions in the insulating tube over and under the insulating plate are spatially connected to each other.

13. The substrate processing apparatus according to claim 12, wherein the lower insulating part includes a plurality of plate members stacked vertically and a column member configured to support the plurality of plate members.

14. The substrate processing apparatus according to claim 12, further comprising an insulating ring installed to surround a side portion of the lower insulating part and made of a material having a thermal conductivity lower than that of the first heat exchanger.

15. A substrate processing apparatus comprising:
a process chamber configured to process a plurality of substrates vertically stacked at predetermined intervals;
a substrate retainer configured to hold the plurality of substrates in the process chamber;
a first heat exchanger installed in the process chamber to support the substrate retainer from a lower portion of the substrate retainer, and configured to perform a heat exchange with a gas flowing in a downward direction from a side of the substrate retainer in the process chamber; and
an induction heating part installed outside the process chamber and disposed to correspond to at least a periphery of a region where the plurality of substrates are stacked,
wherein at least a portion of the first heat exchanger is disposed to overlap with a lower end of the induction heating part,
the first heat exchanger includes a hollow cylindrical insulating tube vertically extending in the downward direction and an insulating plate installed in the insulating tube, and regions in the insulating tube over and under the insulating plate are spatially connected to each other.

* * * * *